US011959943B2

(12) United States Patent
Ota et al.

(10) Patent No.: US 11,959,943 B2
(45) Date of Patent: *Apr. 16, 2024

(54) MAGNETIC FIELD DETECTION APPARATUS AND CURRENT DETECTION APPARATUS

(71) Applicant: TDK CORPORATION, Tokyo (JP)

(72) Inventors: Norikazu Ota, Tokyo (JP); Kenzo Makino, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/825,702

(22) Filed: May 26, 2022

(65) Prior Publication Data
US 2022/0308095 A1 Sep. 29, 2022

Related U.S. Application Data

(63) Continuation of application No. 17/081,232, filed on Oct. 27, 2020, now Pat. No. 11,372,029.

(30) Foreign Application Priority Data

Dec. 11, 2019 (JP) .................................. 2019-224096
Feb. 26, 2020 (JP) .................................. 2020-030876

(51) Int. Cl.
G01R 15/20 (2006.01)
G01R 19/00 (2006.01)
(Continued)

(52) U.S. Cl.
CPC ....... *G01R 15/205* (2013.01); *G01R 19/0092* (2013.01); *G01R 33/091* (2013.01);
(Continued)

(58) Field of Classification Search
CPC ............. G01R 15/205; G01R 19/0092; G01R 33/091; H01F 7/064
See application file for complete search history.

(56) References Cited

U.S. PATENT DOCUMENTS 7,948,349 B2 * 5/2011 Haratani .............. G01R 33/091
336/200
8,178,361 B2 5/2012 Naito et al.
(Continued)

FOREIGN PATENT DOCUMENTS

CN 102812376 A 12/2012
CN 204347226 U 5/2015
(Continued)

OTHER PUBLICATIONS

English Translation of Dec. 23, 2022 Office Action issued in German Patent Application No. 102020130287.8.
(Continued)

*Primary Examiner* — Dominic E Hawkins
(74) *Attorney, Agent, or Firm* — Oliff PLC

(57) ABSTRACT

A magnetic field detection apparatus includes a magnetoresistive effect element and a conductor. The magnetoresistive effect element includes a magnetoresistive effect film extending in a first axis direction and including a first end part, a second end part, and an intermediate part between the first and second end parts. The conductor includes a first part and a second part that each extend in a second axis direction inclined with respect to the first axis direction. The conductor is configured to be supplied with a current and thereby configured to generate an induction magnetic field to be applied to the magnetoresistive effect film in a third axis direction orthogonal to the second axis direction. The first part and the second part respectively overlap the first end part and the second end part in a fourth axis direction
(Continued)

orthogonal to both of the second axis direction and the third axis direction.

12 Claims, 30 Drawing Sheets

(51) Int. Cl.
    *G01R 33/09*     (2006.01)
    *H01C 7/00*     (2006.01)
    *H01F 7/06*     (2006.01)
    *H01F 27/28*     (2006.01)

(52) U.S. Cl.
    CPC ............... *H01C 7/00* (2013.01); *H01F 7/064* (2013.01); *H01F 27/28* (2013.01)

(56) References Cited

U.S. PATENT DOCUMENTS

| | | |
|---|---|---|
| 8,952,689 B2 | 2/2015 | Ide et al. |
| 9,018,946 B2 | 4/2015 | Paci et al. |
| 10,295,578 B2 | 5/2019 | Higashi et al. |
| 11,002,803 B2 | 5/2021 | Takano et al. |
| 11,372,029 B2 * | 6/2022 | Ota .................... H01F 27/28 |
| 11,531,071 B2 | 12/2022 | Takano et al. |
| 2006/0145690 A1 | 7/2006 | Shoji |
| 2007/0253120 A1 | 11/2007 | Saito et al. |
| 2014/0266187 A1 | 9/2014 | Mather |
| 2016/0169987 A1 * | 6/2016 | Deak ...................... G01R 33/09 |
| | | 324/252 |
| 2017/0115363 A1 | 4/2017 | Jiang et al. |
| 2019/0377032 A1 | 12/2019 | Takano et al. |
| 2021/0181241 A1 | 6/2021 | Ota et al. |

FOREIGN PATENT DOCUMENTS

| | | |
|---|---|---|
| DE | 102019113639 A1 | 12/2019 |
| EP | 2671224 B1 | 12/2021 |
| EP | 3309572 B1 | 1/2022 |
| JP | 2016-001118 A | 1/2016 |
| JP | 2016-090440 A | 5/2016 |
| WO | 2013/129276 A1 | 9/2013 |

OTHER PUBLICATIONS

English Translation of Aug. 2, 2023 Office Action issued in German Patent Application No. 102020130287.8.

* cited by examiner

MAGNETIC FIELD DETECTION APPARATUS AND CURRENT DETECTION APPARATUS

CROSS REFERENCE TO RELATED APPLICATIONS

This is a Continuation Application of U.S. patent application Ser. No. 17/081,232, filed Oct. 27, 2020, which claims the benefit of Japanese Priority Patent Application Nos. 2019-224096 filed on Dec. 11, 2019 and 2020-030876 filed on Feb. 26, 2020, the entire contents of each of which are incorporated herein by reference.

BACKGROUND

The disclosure relates to a magnetic field detection apparatus and a current detection apparatus each of which includes a magnetoresistive effect element.

Some magnetic field detection apparatuses using magnetoresistive effect elements have been proposed. For example, Japanese Unexamined Patent Application Publication No. 2016-001118 discloses a magnetic field detection apparatus including a magnetoresistive effect element and a conductor, in which a centerline of the conductor along the direction of a current flow and a centerline of the magnetoresistive effect element along the direction of its length are oriented in different directions from each other.

SUMMARY

A first magnetic field detection apparatus according to one embodiment of the disclosure includes a magnetoresistive effect element and a conductor. The magnetoresistive effect element includes a magnetoresistive effect film that extends in a first axis direction and includes a first end part, a second end part, and an intermediate part between the first end part and the second end part. The conductor includes a first part and a second part each extending in a second axis direction inclined with respect to the first axis direction. The conductor is configured to be supplied with a current and thereby configured to generate an induction magnetic field to be applied to the magnetoresistive effect film in a third axis direction orthogonal to the second axis direction. Here, the first part and the second part respectively overlap the first end part and the second end part in a fourth axis direction orthogonal to both of the second axis direction and the third axis direction.

A second magnetic field detection apparatus according to one embodiment of the disclosure includes a first and a second magnetoresistive effect element, and a first and a second conductor. The first magnetoresistive effect element includes a first magnetoresistive effect film that extends in a first axis direction. The first conductor includes a first part and a second part that each extend in a second axis direction inclined with respect to the first axis direction and that are adjacent to each other in a third axis direction different from both of the first axis direction and the second axis direction. The second conductor includes a third part and a fourth part that each extend in the second axis direction and that are adjacent to each other in the third axis direction. The second magnetoresistive effect element includes a second magnetoresistive effect film that extends in the first axis direction. The first magnetoresistive effect film includes a first end part, a second end part, and a first intermediate part between the first end part and the second end part. The second magnetoresistive effect film includes a third end part, a fourth end part, and a second intermediate part between the third end part and the fourth end part. The first part and the second part of the first conductor respectively overlap the first end part and the second end part of the first magnetoresistive effect film in a fourth axis direction orthogonal to both of the second axis direction and the third axis direction. The first part and the second part are each configured to be supplied with a first current and thereby configured to generate a first induction magnetic field to be applied to the first end part and the second end part in the third axis direction. The third part and the fourth part of the second conductor respectively overlap the third end part and the fourth end part of the second magnetoresistive effect film in the fourth axis direction. The third part and the fourth part are each configured to be supplied with a second current and thereby configured to generate a second induction magnetic field to be applied to the third end part and the fourth end part in the third axis direction.

A current detection apparatus according to one embodiment of the disclosure includes a magnetoresistive effect element, a first conductor, and a second conductor. The magnetoresistive effect element includes a magnetoresistive effect film that extends in a first axis direction and includes a first end part, a second end part, and an intermediate part between the first end part and the second end part. The first conductor includes a first part and a second part that each extend in a second axis direction inclined with respect to the first axis direction. The first conductor is configured to be supplied with a first current and thereby configured to generate a first induction magnetic field to be applied to the magnetoresistive effect film in a first direction along a third axis direction orthogonal to the second axis direction. The second conductor is configured to be supplied with a second current and thereby configured to generate a second induction magnetic field to be applied to the magnetoresistive effect film in a second direction opposite to the first direction. The first part and the second part respectively overlap the first end part and the second end part in a fourth axis direction orthogonal to both of the second axis direction and the third axis direction.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
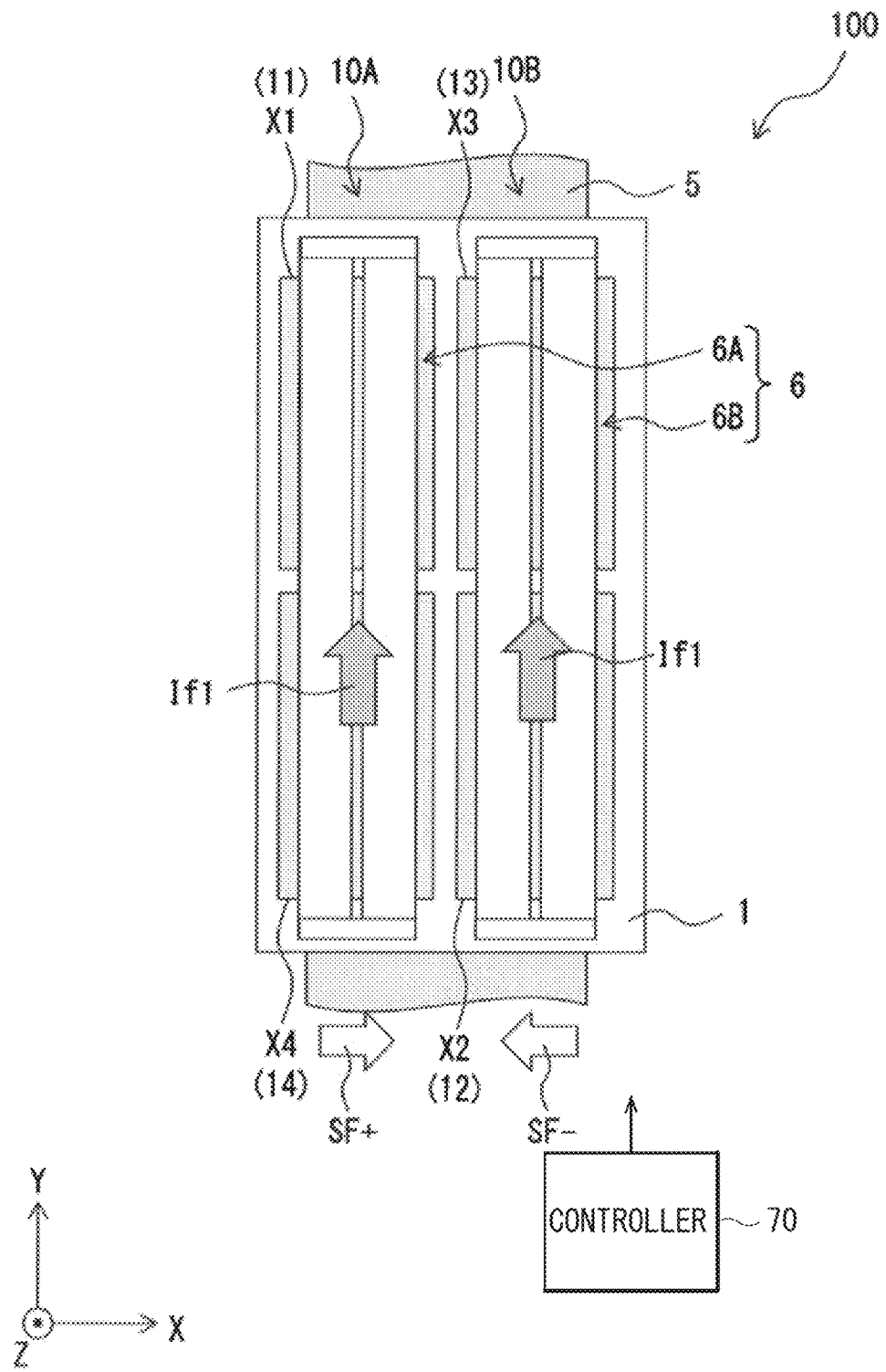
FIG. 1 is a schematic planar diagram illustrating an overall configuration example of a current detection apparatus according to one example embodiment of the disclosure.

It is demanded that magnetic field detection apparatuses using magnetoresistive effect elements be reduced in size and improved in detection accuracy.

It is desirable to provide a magnetic field detection apparatus and a current detection apparatus that achieve high detection accuracy while being small in size.

In the following, some example embodiments and modification examples of the technology are described in detail with reference to the accompanying drawings. Note that the following description is directed to illustrative examples of the technology and not to be construed as limiting the technology. Factors including, without limitation, numerical values, shapes, materials, components, positions of the components, and how the components are coupled to each other are illustrative only and not to be construed as limiting the technology. Further, elements in the following example embodiments which are not recited in a most-generic independent claim of the disclosure are optional and may be provided on an as-needed basis. The drawings are schematic and are not intended to be drawn to scale. Like elements are denoted with the same reference numerals to avoid redundant descriptions. Note that the description is given in the following order.

1. Example Embodiment (an example of a current detection apparatus that detects a current flowing through a bus and includes a bridge circuit and a helical coil, the bridge circuit including four magnetoresistive effect elements, the helical coil having a winding direction that reverses at an intermediate point along the coil)
2. Modification Examples

1. Example Embodiment

[Configuration of Current Detection Apparatus 100]

First, a configuration of a current detection apparatus 100 according to an example embodiment of the disclosure will be described with reference to FIGS. 1 to 7.

FIG. 1 is a schematic planar diagram illustrating an overall configuration example of the current detection apparatus 100. As illustrated in FIG. 1, the current detection apparatus 100 may include a current line (a bus) 5 to be supplied with a signal current Im (Im1, Im2) to be detected, and a substrate 1 provided with current detection units 10A and 10B. The current detection unit 10A may include a magnetoresistive effect element 11 formed in an element formation region X1, a magnetoresistive effect element 14 formed in an element formation region X4, and a coil part 6A. The current detection unit 10B may include a magnetoresistive effect element 13 formed in an element formation region X3, a magnetoresistive effect element 12 formed in an element formation region X2, and a coil part 6B. The coil part 6A and the coil part 6B may be coupled to each other in series to form a single helical coil 6. The helical coil 6 is configured to be supplied with a feedback current If (If1, If2), a setting current Is, and a resetting current Ir, all of which will be described in detail later. Note that the feedback current If, the setting current Is, and the resetting current Ir may be supplied to the helical coil 6 at mutually different timings.

The magnetoresistive effect elements 11 to 14 in the present example embodiment may each correspond to a specific but non-limiting example of a "magnetoresistive effect element" according to one embodiment of the disclosure. Each of the magnetoresistive effect elements 11 and 14 may also correspond to a specific but non-limiting example of a "first magnetoresistive effect element" according to one embodiment of the disclosure, and each of the magnetoresistive effect elements 12 and 13 may also correspond to a specific but non-limiting example of a "second magnetoresistive effect element" according to one embodiment of the disclosure. Further, the helical coil 6 may correspond to a specific but non-limiting example of a "conductor" and a "first conductor" according to one embodiment of the disclosure. The bus 5 may correspond to a specific but non-limiting example of a "second conductor" according to one embodiment of the disclosure.

[Current Detection Unit 10A]

Figure 2A:
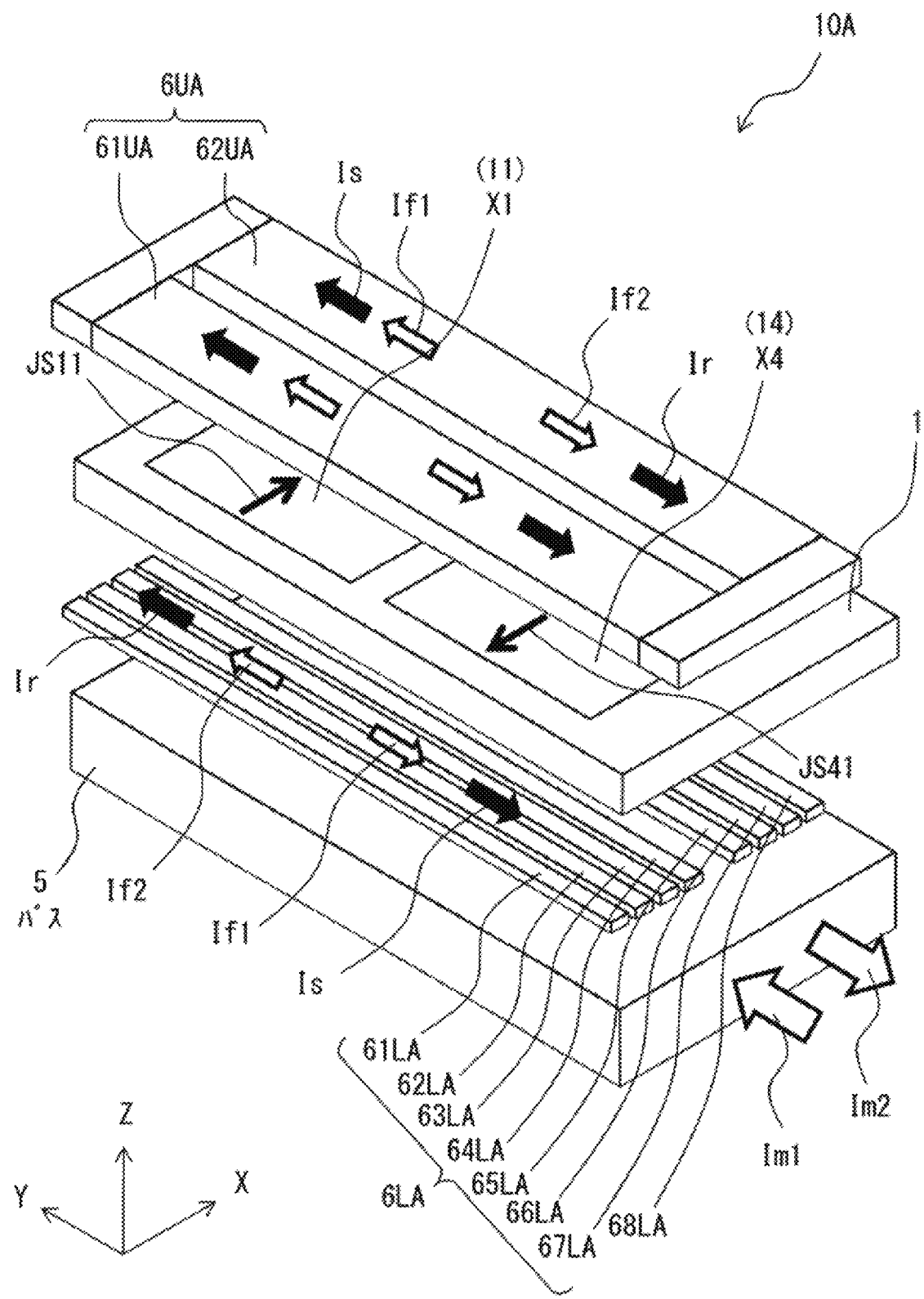
FIG. 2A is a perspective diagram illustrating an overall configuration example of a first current detection unit illustrated in FIG. 1.

FIG. 2A is an enlarged perspective view of the current detection unit 10A illustrated in FIG. 1. As illustrated in FIG. 2A, the current detection unit 10A may have a structure in which, for example, a lower wiring line 6LA, the substrate 1 including the magnetoresistive effect element 11 and the magnetoresistive effect element 14 arranged side by side in a Y-axis direction, and an upper wiring line 6UA are stacked in this order in a Z-axis direction above the bus 5. The upper wiring line 6UA and the lower wiring line 6LA may constitute a portion of the coil part 6A and may be coupled to each other in series. FIG. 2A illustrates an example in which the lower wiring line 6LA includes eight lower wiring line patterns 61LA to 68LA, and the upper wiring line 6UA includes two upper wiring line patterns 61UA and 62UA. In an embodiment of the disclosure, however, the number of the lower wiring line patterns of the lower wiring line 6LA and the number of the upper wiring line patterns of the upper wiring line 6UA are not limited to these numbers and may be set to any numbers. The eight lower wiring line patterns 61LA to 68LA may be coupled to a single power supply in parallel. The two upper wiring line patterns 61UA and 62UA may also be coupled to the power supply in parallel. Because the upper wiring line 6UA and the lower wiring line 6LA may be coupled to each other in series, in a case where, for example, a setting current Is in a +Y direction flows through the upper wiring line 6UA (the upper wiring line patterns 61UA and 62UA), a setting current Is in a −Y direction may flow through the lower wiring line 6LA (the eight lower wiring line patterns 61LA to 68LA). In a case where a resetting current Ir in the −Y direction flows through the upper wiring line 6UA, a resetting current Ir in the +Y direction may flow through the lower wiring line 6LA. Further, in a case where a signal current Im1 in the +Y direction flows through the bus 5, a feedback current If1 in the +Y direction may flow through the upper wiring line 6UA, and a feedback current If1 in the −Y direction may flow through the lower wiring line 6LA. Further, in a case where a signal current Im2 in the −Y direction flows through the bus 5, a feedback current If2 in the −Y direction may flow through the upper wiring line 6UA, and a feedback current If2 in the +Y direction may flow through the lower wiring line 6LA. Note that a reference sign If1 in FIG. 1 indicates the direction of the feedback current flowing through the upper wiring line 6UA and the lower wiring line 6LA. In FIG. 2A, an arrow with a reference sign JS11 indicates a direction of a magnetization JS11 of a magnetization pinned layer S11 (described later) of a magnetoresistive effect film MR1 (described later) included in the magnetoresistive effect element 11, and an arrow with a reference sign JS41 indicates a direction of a magnetization JS41 of a magnetization pinned layer S41 (described later) of a magnetoresistive effect film MR4 (described later) included in the magnetoresistive effect element 14.

The upper wiring line patterns 61UA and 62UA and the lower wiring line patterns 61LA to 68LA may all extend in the Y-axis direction. The lower wiring line patterns 61LA to 64LA may be disposed opposite to the upper wiring line pattern 61UA, with the magnetoresistive effect elements 11 and 14 being interposed between the upper wiring line pattern 61UA and the lower wiring line patterns 61LA to 64LA in the Z-axis direction. The lower wiring line patterns 65LA to 68LA may be disposed opposite to the upper wiring line pattern 62UA, with the magnetoresistive effect elements 11 and 14 being interposed between the upper wiring line pattern 62UA and the lower wiring line patterns 65LA to 68LA in the Z-axis direction.

Here, the upper wiring line pattern 61UA may correspond to a specific but non-limiting example of a "first part" according to one embodiment of the disclosure, and the upper wiring line pattern 62UA may correspond to a specific but non-limiting example of a "second part" according to one embodiment of the disclosure. Further, the lower wiring line patterns 61LA to 64LA may each correspond to a specific but non-limiting example of a "third part" according to one embodiment of the disclosure, and the lower wiring line patterns 65LA to 68LA may each correspond to a specific but non-limiting example of a "fourth part" according to one embodiment of the disclosure.

[Current Detection Unit 10B]

Figure 2B:
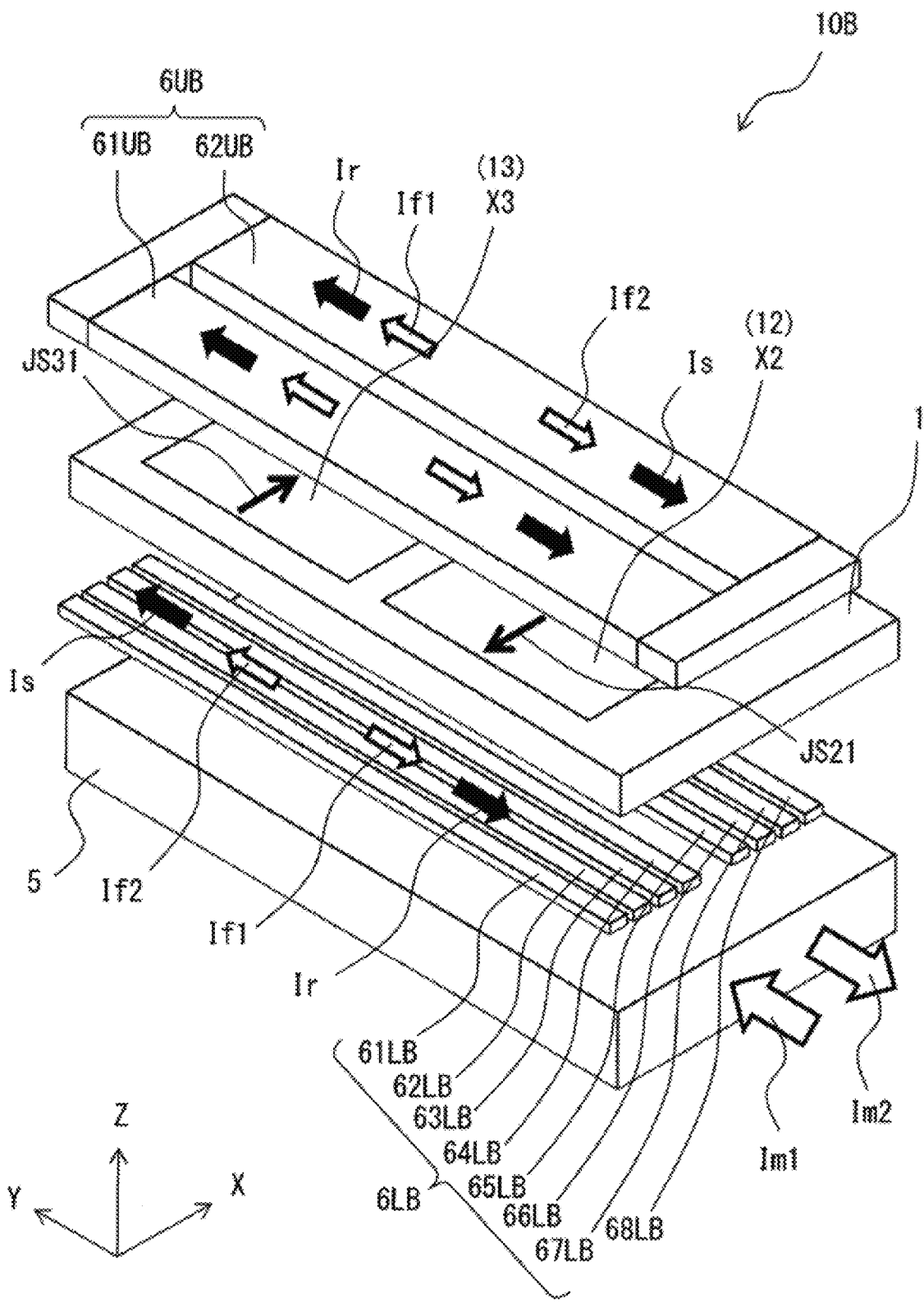
FIG. 2B is a perspective diagram illustrating an overall configuration example of a second current detection unit illustrated in FIG. 1.

FIG. 2B is an enlarged perspective view of the current detection unit 10B illustrated in FIG. 1. As illustrated in FIG. 2B, the current detection unit 10B may have a structure in which, for example, a lower wiring line 6LB, the substrate 1 including the magnetoresistive effect element 13 and the magnetoresistive effect element 12 arranged side by side in the Y-axis direction, and the upper wiring line 6UB are stacked in this order in the Z-axis direction above the bus 5. Note that the bus 5 and the substrate 1 may be common between the current detection unit 10A and the current detection unit 10B. The upper wiring line 6UB and the lower wiring line 6LB may constitute a portion of the coil part 6B and may be coupled to each other in series. FIG. 2B illustrates an example in which the lower wiring line 6LB includes eight lower wiring line patterns 61LB to 68LB, and the upper wiring line 6UB includes two upper wiring line patterns 61UB and 62UB. In an embodiment of the disclosure, however, the number of the lower wiring line patterns of the lower wiring line 6LB and the number of the upper wiring line patterns of the upper wiring line 6UB are not limited to these numbers and may be set to any numbers. The eight lower wiring line patterns 61LB to 68LB may be coupled to the foregoing power supply in parallel. The two upper wiring line patterns 61UB and 62UB may also be coupled to the power supply in parallel. In FIG. 2B, an arrow with a reference sign JS31 indicates a direction of a magnetization JS31 of a magnetization pinned layer S31 (described later) of a magnetoresistive effect film MR3 (described later) included in the magnetoresistive effect element 13, and an arrow with a reference sign JS21 indicates a direction of a magnetization JS21 of a magnetization pinned layer S21 (described later) of a magnetoresistive effect film MR2 (described later) included in the magnetoresistive effect element 12.

Because the coil part 6A and the coil part 6B may be coupled to each other in series, a setting current Is and a resetting current Ir supplied from the power supply common between the coil part 6A and the coil part 6B may flow through the coil part 6B. In the current detection unit 10B, however, the setting current Is and the resetting current Ir may flow in directions opposite to those in the current detection unit 10A. In a specific but non-limiting example, in a case where a setting current Is in the −Y direction flows through the upper wiring line 6UB (the upper wiring line patterns 61UB and 62UB), a setting current Is in the +Y direction may flow through the lower wiring line 6LB (the eight lower wiring line patterns 61LB to 68LB). In a case where a resetting current Ir in the +Y direction flows through the upper wiring line 6UB (the upper wiring line patterns 61UB and 62UB), a resetting current Ir in the −Y direction may flow through the lower wiring line 6LB (the eight lower wiring line patterns 61LB to 68LB). Further, in a case where a signal current Im1 in the +Y direction flows through the bus 5, a feedback current If1 in the +Y direction may flow through the upper wiring line 6UB, and a feedback current If1 in the −Y direction may flow through the lower wiring line 6LB. Further, in a case where a signal current Im2 in the −Y direction flows through the bus 5, a feedback current If2 in the −Y direction may flow through the upper wiring line 6UB, and a feedback current If2 in the +Y direction may flow through the lower wiring line 6LB. Note that the reference sign If1 in FIG. 1 indicates the direction of the feedback current flowing through the upper wiring line 6UB and the upper wiring line 6UA.

The upper wiring line patterns 61UB and 62UB and the lower wiring line patterns 61LB to 68LB may all extend in the Y-axis direction. The lower wiring line patterns 61LB to 64LB may be disposed opposite to the upper wiring line pattern 61UB, with the magnetoresistive effect elements 13 and 12 being interposed between the upper wiring line pattern 61UB and the lower wiring line patterns 61LB to 64LB in the Z-axis direction. The lower wiring line patterns 65LB to 68LB may be disposed opposite to the upper wiring line pattern 62UB, with the magnetoresistive effect elements 13 and 12 being interposed between the upper wiring line pattern 62UB and the lower wiring line patterns 65LB to 68LB in the Z-axis direction.

Here, the upper wiring line pattern 61UB may correspond to a specific but non-limiting example of the "first part" according to one embodiment of the disclosure, and the upper wiring line pattern 62UB may correspond to a specific but non-limiting example of the "second part" according to one embodiment of the disclosure. Further, the lower wiring line patterns 61LB to 64LB may each correspond to a specific but non-limiting example of the "third part" according to one embodiment of the disclosure, and the lower wiring line patterns 65LB to 68LB may each correspond to a specific but non-limiting example of the "fourth part" according to one embodiment of the disclosure.

[Magnetoresistive Effect Element 11]

Figure 3A:
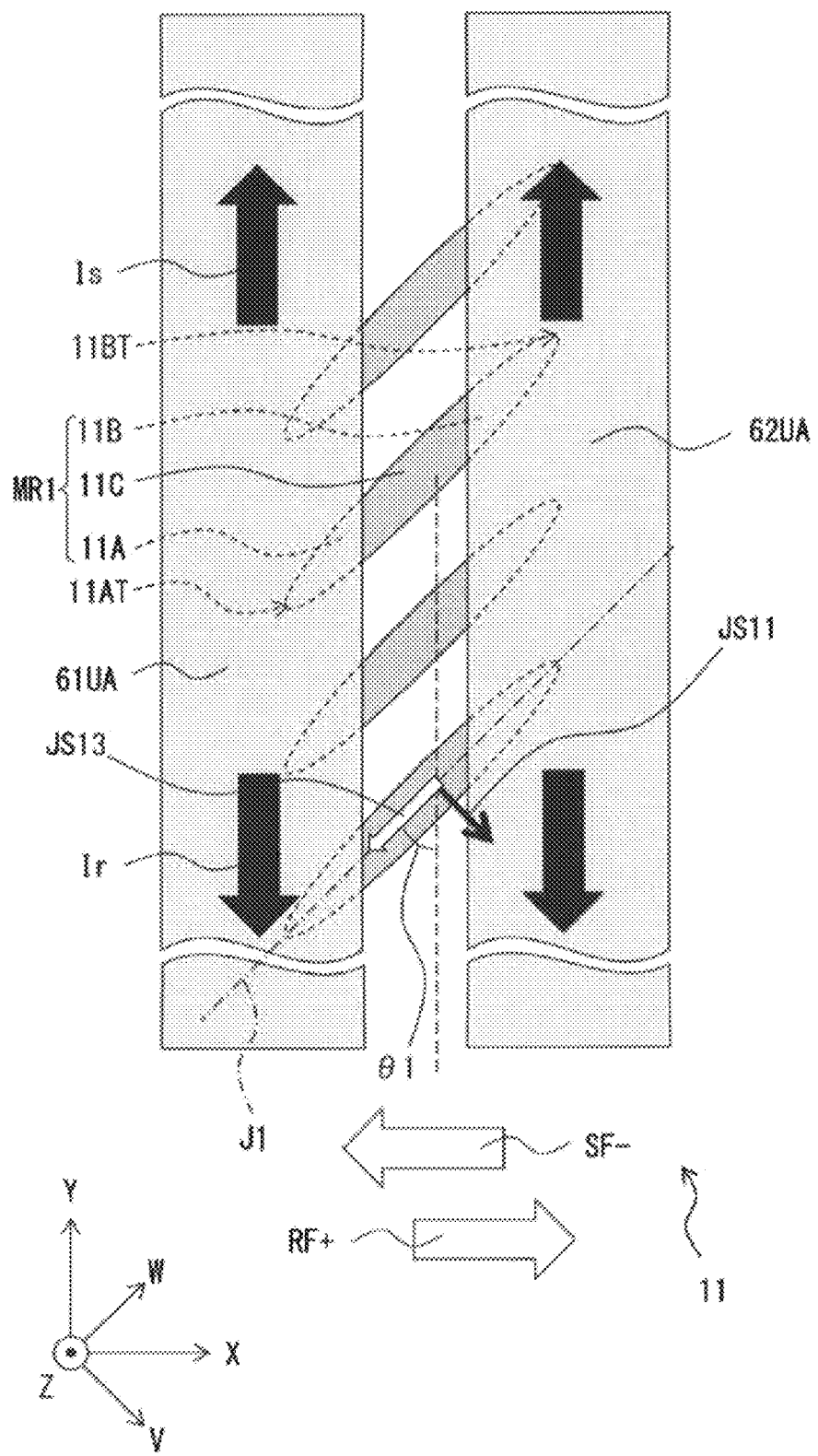
FIG. 3A is a planar diagram for explaining a detailed configuration of a first magnetoresistive effect element formed in a first element formation region illustrated in FIG. 2A.

FIG. 3A is a planar diagram for explaining a detailed configuration of the magnetoresistive effect element 11 formed in the element formation region X1 of the current detection unit 10A. Further, FIGS. 3B to 3E are cross-sectional diagrams each illustrating a portion of the current detection unit 10A. Note that FIG. 3A illustrates a plurality of magnetoresistive effect films MR1 constituting the magnetoresistive effect element 11 and the upper wiring line patterns 61UA and 62UA disposed above the magnetoresistive effect films MR1, and omits other components.

As illustrated in FIG. 3A, the magnetoresistive effect element 11 may include a plurality of magnetoresistive effect films MR1 arranged in the Y-axis direction. The plurality of magnetoresistive effect films MR1 may be coupled to each other in series, and may each extend in a W-axis direction that is inclined with respect to both of an X-axis direction and the Y-axis direction. Thus, the plurality of magnetoresistive effect films MR1 may each have a shape anisotropy in the W-axis direction. An angle θ1 formed between the W-axis direction and the Y-axis direction may be 45°, for example. Each of the plurality of magnetoresistive effect films MR1 includes a first end part 11A, a second end part 11B, and an intermediate part 11C between the first end part 11A and the second end part 11B. The first end part 11A and the second end part 11B may be portions that respectively include a first end 11AT and a second end 11BT of the magnetoresistive effect film MR1 that are opposite to each other in the W-axis direction. Further, in FIG. 3A, an arrow with a reference sign JS13 indicates a magnetization direction of a magnetization free layer S13 (described later) in an initial state in each magnetoresistive effect film MR1. In a specific but non-limiting example, the direction of the magnetization JS13 of the magnetization free layer S13 in the initial state may be substantially parallel to the W-axis direction. Further, an arrow with the reference sign JS11 in FIG. 3A indicates the direction of the magnetization JS11 of the magnetization pinned layer S11 (described later) in each magnetoresistive effect film MR1. In a specific but non-limiting example, the direction of the magnetization JS11 may be substantially parallel to a V-axis direction orthogonal to the W-axis direction. The magnetoresistive effect films MR1 may thus have sensitivity in the V-axis direction.

Here, the W-axis direction J1 may correspond to a specific but non-limiting example of a "first axis direction" according to one embodiment of the disclosure. The Y-axis direction may correspond to a specific but non-limiting example of a "second axis direction" according to one embodiment of the disclosure. The X-axis direction may correspond to a specific but non-limiting example of a "third axis direction" according to one embodiment of the disclosure. The Z-axis direction may correspond to a specific but non-limiting example of a "fourth axis direction" according to one embodiment of the disclosure.

The upper wiring line pattern 61UA and the upper wiring line pattern 62UA of the helical coil 6 overlap the first end part 11A and the second end part 11B, respectively, in the Z-axis direction. The lower wiring line patterns 61LA to 64LA of the helical coil 6 may each overlap the first end part 11A in the Z-axis direction. Likewise, the lower wiring line patterns 65LA to 68LA of the helical coil 6 may each overlap the second end part 11B in the Z-axis direction. In a specific but non-limiting example, the upper wiring line pattern 61UA may overlap the first end 11AT in the first end part 11A in the Z-axis direction, and the upper wiring line pattern 62UA may overlap the second end 11BT in the second end part 11B in the Z-axis direction.

Figure 3B:
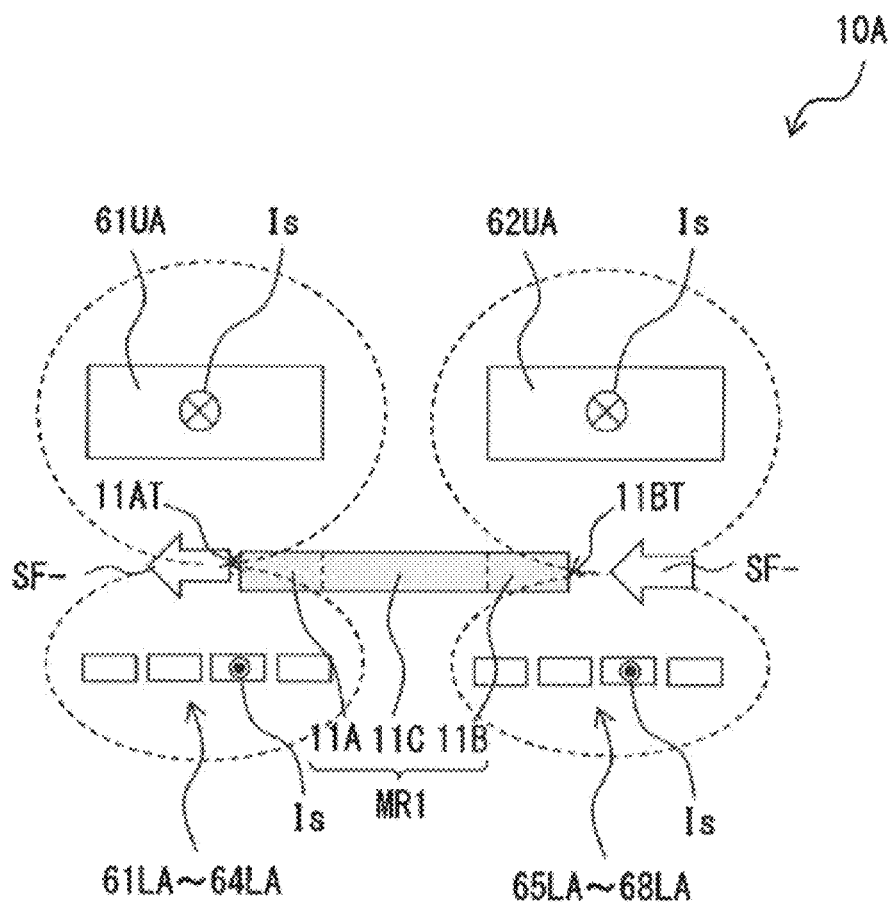
FIG. 3B is a schematic cross-sectional diagram illustrating a setting operation in the first current detection unit illustrated in FIG. 2A.
Figure 3C:
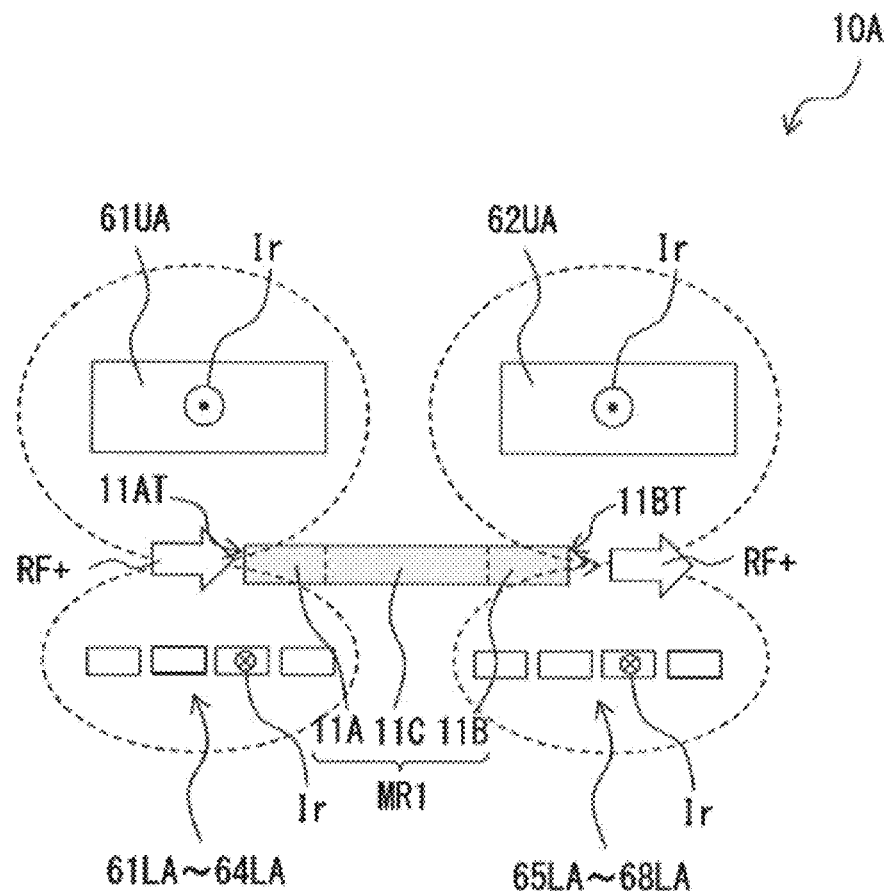
FIG. 3C is a schematic cross-sectional diagram illustrating a resetting operation in the first current detection unit illustrated in FIG. 2A.
Figure 3D:
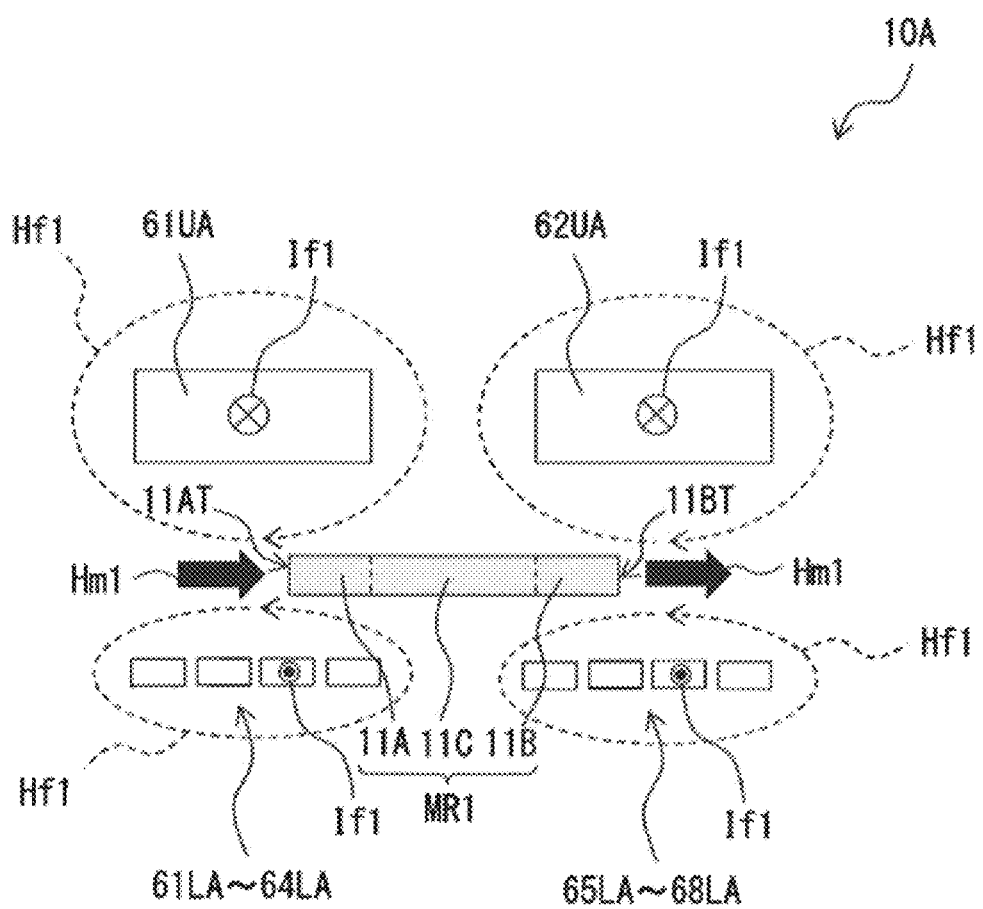
FIG. 3D is a first schematic cross-sectional diagram illustrating a current detection operation in the first current detection unit illustrated in FIG. 2A.
Figure 3D:
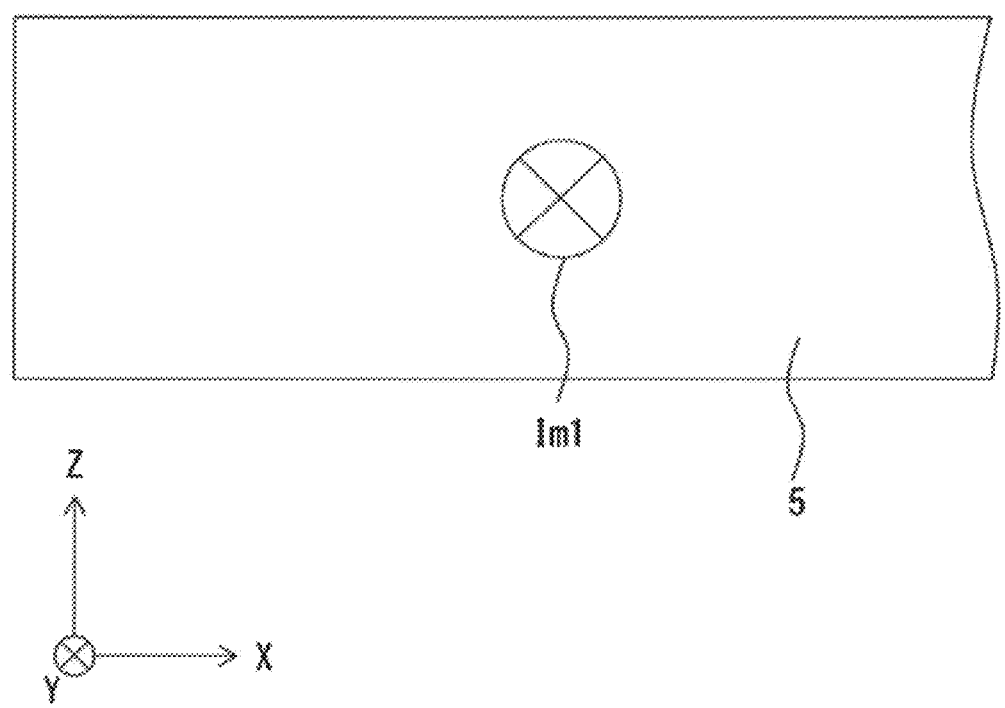
Figure 3E:
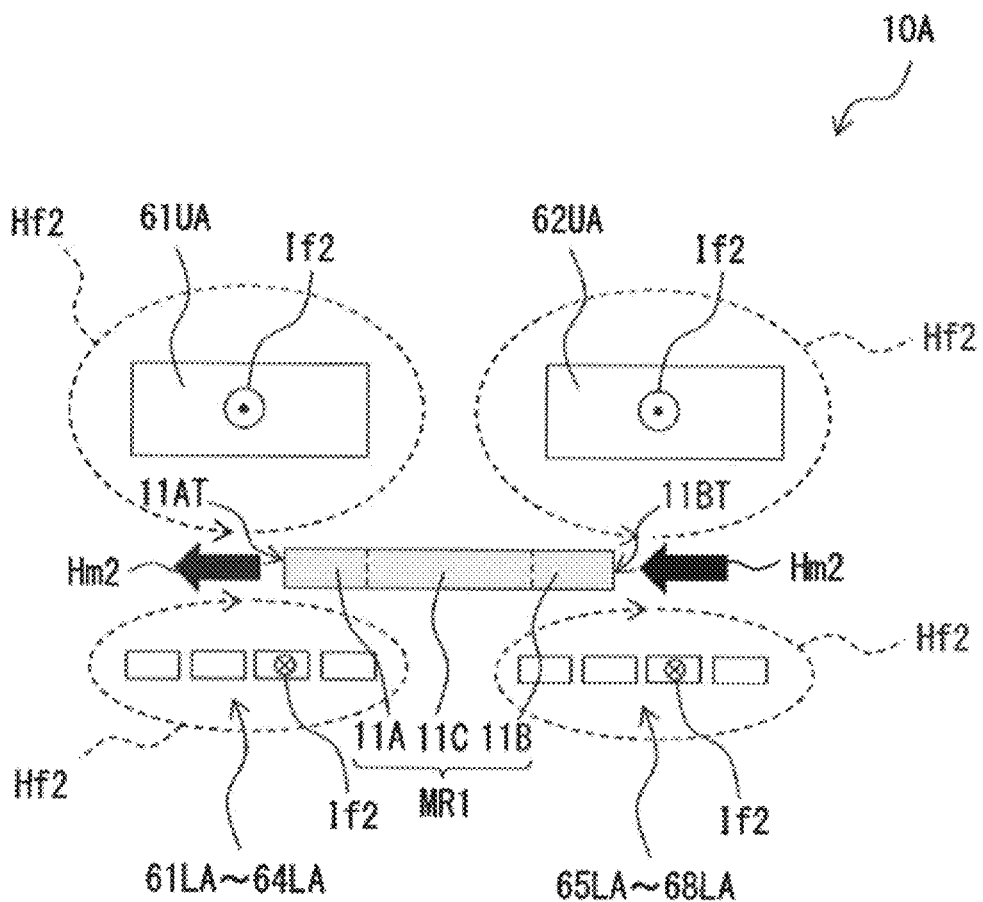
FIG. 3E is a second schematic cross-sectional diagram illustrating the current detection operation in the first current detection unit illustrated in FIG. 2A.
Figure 3E:
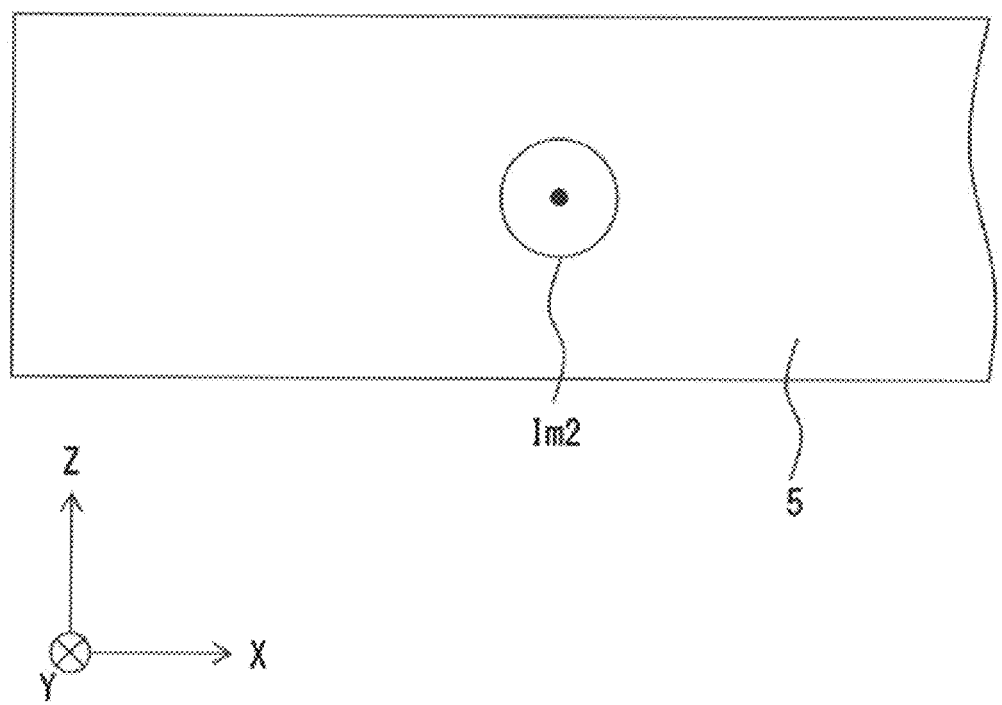

Thus, in the current detection unit 10A, as illustrated in FIGS. 3A and 3B, supplying the helical coil 6 with a setting current Is causes a setting magnetic field SF− in a −X direction to be applied to the magnetoresistive effect film MR1. As illustrated in FIG. 3C, supplying the helical coil 6 with a resetting current Ir causes a resetting magnetic field RF+ in a +X direction to be applied to the magnetoresistive effect film MR1. Further, as illustrated in FIG. 3D, in a case where a signal current Im1 in the +Y direction flows through the bus 5, a signal magnetic field Hm1 in the +X direction may be applied to the magnetoresistive effect film MR1. In this case, supplying the helical coil 6 with a feedback current If1 may cause a feedback magnetic field Hf1 in the −X direction to be applied to the magnetoresistive effect film MR1 to cancel out the signal magnetic field Hm1. Further, as illustrated in FIG. 3E, in a case where a signal current Im2 in the −Y direction flows through the bus 5, a signal magnetic field Hm2 in the −X direction may be applied to the magnetoresistive effect film MR1. In this case, supplying the helical coil 6 with a feedback current If2 may cause a feedback magnetic field Hf2 in the +X direction to be applied to the magnetoresistive effect film MR1 to cancel out the signal magnetic field Hm2.

It is to be noted that the setting magnetic field SF (SF+, SF−) and the resetting magnetic field RF (RF+, RF−) may correspond to a specific but non-limiting example of an "induction magnetic field" or a "first induction magnetic field" according to one embodiment of the disclosure.

Figure 3F:
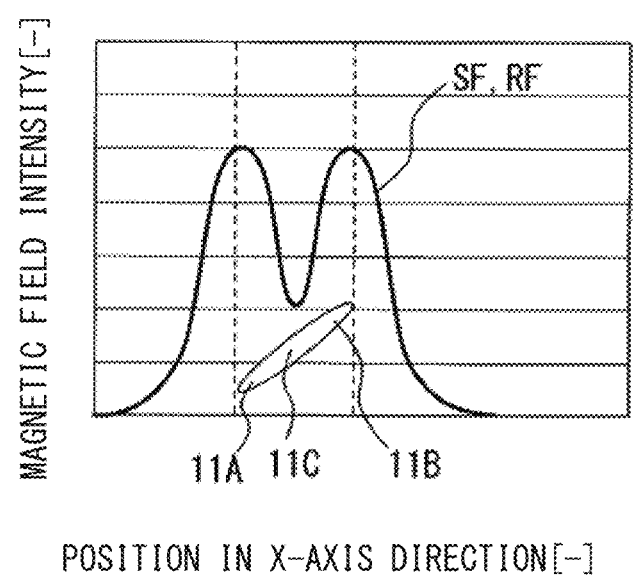
FIG. 3F is an explanatory diagram illustrating intensity distributions of a setting magnetic field and a resetting magnetic field to be applied to a first magnetoresistive effect film illustrated in FIG. 3A.

As illustrated in FIG. 3F, intensities (absolute values) of the setting magnetic field SF and the resetting magnetic field RF to be applied to each of the first end part 11A and the second end part 11B may be higher than intensities (absolute values) of the setting magnetic field SF and the resetting magnetic field RF to be applied to the intermediate part 11C. One reason for this is that the first end part 11A and the second end part 11B respectively overlap the upper wiring line pattern 61UA and the upper wiring line pattern 62UA in the Z-axis direction whereas no upper wiring line patterns or no lower wiring line patterns overlap the intermediate part 11C in the Z-axis direction; in other words, the intermediate part 11C is disposed farther from the upper wiring line patterns 61UA and 62UA and the lower wiring line patterns 61LA to 68LA of the helical coil 6, compared with the first end part 11A and the second end part 11B. Note that FIG. 3F is an explanatory diagram illustrating the intensity distribution in the X-axis direction of the setting magnetic field SF and the resetting magnetic field RF to be applied to the magnetoresistive effect film MR1. In FIG. 3F, the horizontal axis represents position (arbitrary units) in the X-axis direction, and the vertical axis represents the magnetic field intensity (arbitrary units).

[Magnetoresistive Effect Element 14]

Figure 3G:
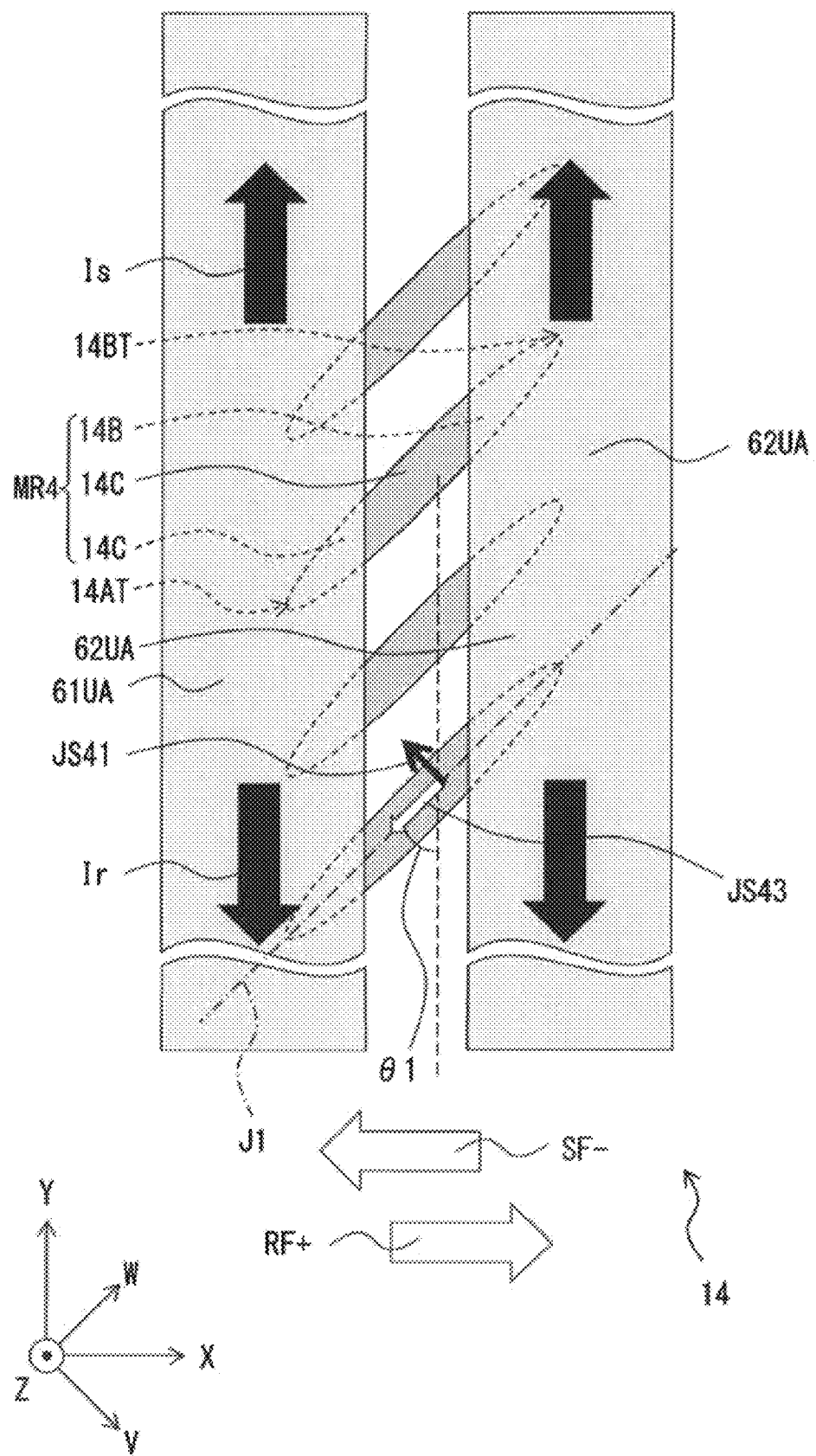
FIG. 3G is a planar diagram for explaining a detailed configuration of a fourth magnetoresistive effect element formed in a fourth element formation region illustrated in FIG. 2A.

FIG. 3G is a planar diagram for explaining a detailed configuration of the magnetoresistive effect element 14 formed in the element formation region X4 of the current detection unit 10A. Note that FIG. 3G illustrates a plurality of magnetoresistive effect films MR4 constituting the magnetoresistive effect element 14 and the upper wiring line patterns 61UA and 62UA disposed above the magnetoresistive effect films MR4, and omits other components.

As illustrated in FIG. 3G, the magnetoresistive effect element 14 may include a plurality of magnetoresistive effect films MR4 arranged in the Y-axis direction. The plurality of magnetoresistive effect films MR4 may be coupled to each other in series, and each extend in the W-axis direction that is inclined with respect to both of the X-axis direction and the Y-axis direction. Thus, the plurality of magnetoresistive effect films MR4 may each have a shape anisotropy in the W-axis direction. Each of the plurality of magnetoresistive effect films MR4 includes a first end part 14A, a second end part 14B, and an intermediate part 14C between the first end part 14A and the second end part 14B. Note that the first end part 14A and the second end part 14B may be portions that respectively include a first end 14AT and a second end 14BT of the magnetoresistive effect film MR4 that are opposite to each other in the W-axis direction. Further, in FIG. 3G, an arrow with a reference sign JS43 indicates a magnetization direction of a magnetization free layer S43 (described later) in an initial state in each magnetoresistive effect film MR4. The direction of the magnetization JS43 of the magnetization free layer S43 in the initial state may be substantially parallel to the W-axis direction. Further, an arrow with the reference sign JS41 in FIG. 3G indicates the direction of the magnetization JS41 of the magnetization pinned layer S41 (described later) in each magnetoresistive effect film MR4. The direction of the magnetization JS41 may be substantially parallel to the V-axis direction orthogonal to the W-axis direction. The magnetoresistive effect films MR4 may thus have sensitivity in the V-axis direction.

The upper wiring line pattern 61UA and the upper wiring line pattern 62UA of the helical coil 6 overlap the first end part 14A and the second end part 14B, respectively, in the Z-axis direction. The lower wiring line patterns 61LA to 64LA of the helical coil 6 may each overlap the first end part 11A in the Z-axis direction. Likewise, the lower wiring line patterns 65LA to 68LA of the helical coil 6 may each overlap the second end part 14B in the Z-axis direction. In a specific but non-limiting example, the upper wiring line pattern 61UA may overlap the first end 14AT in the first end part 14A in the Z-axis direction, and the upper wiring line pattern 62UA may overlap the second end 14BT in the second end part 14B in the Z-axis direction. Thus, in the magnetoresistive effect element 14, as in the magnetoresistive effect element 11, supplying the helical coil 6 with the setting current Is causes the setting magnetic field SF− in the −X direction to be applied to the magnetoresistive effect film MR4. Further, supplying the helical coil 6 with the resetting current Ir causes the resetting magnetic field RF+ in the +X direction to be applied to the magnetoresistive effect film MR4.

[Magnetoresistive Effect Element 13]

Figure 4A:
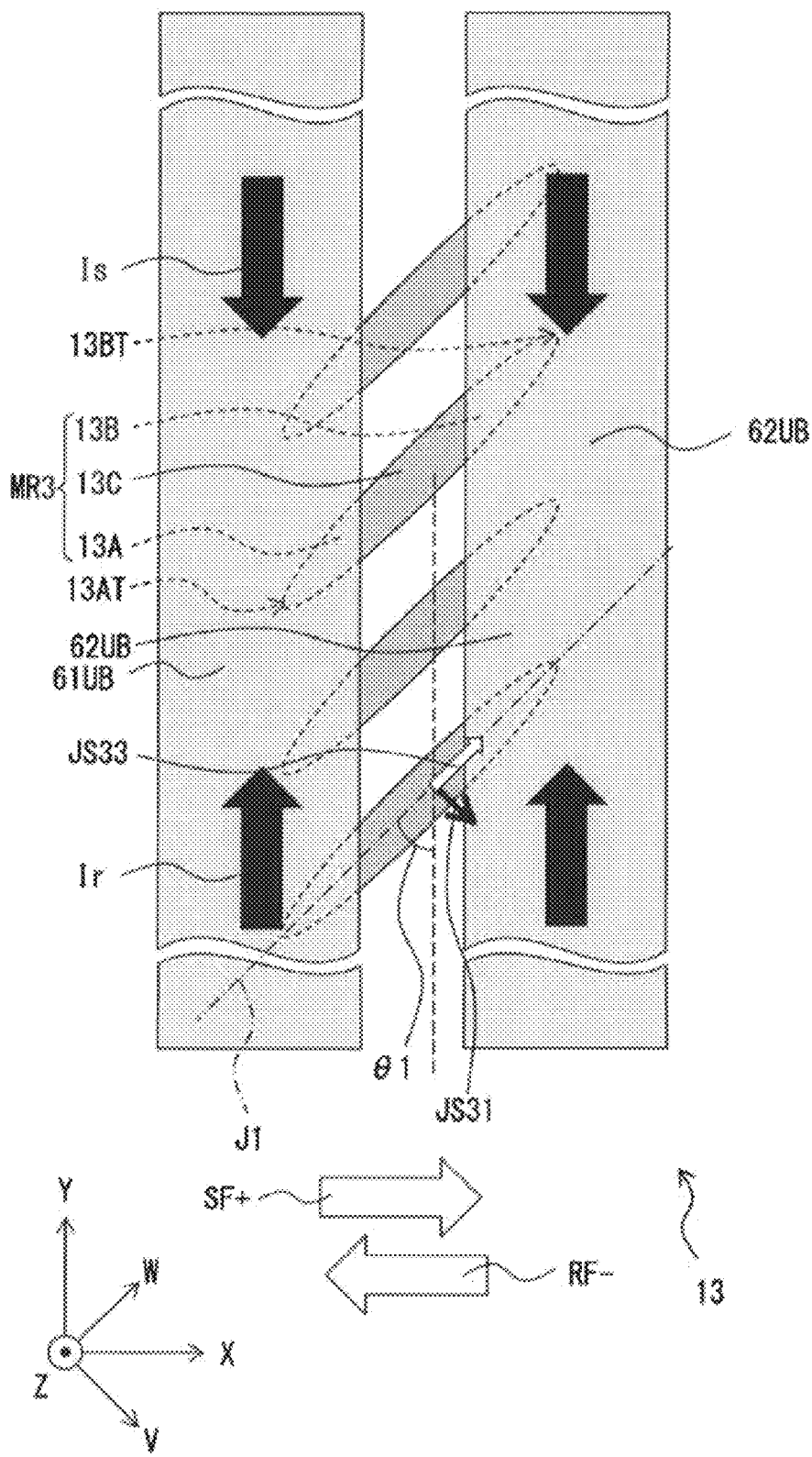
FIG. 4A is a planar diagram for explaining a detailed configuration of a third magnetoresistive effect element formed in a third element formation region illustrated in FIG. 2B.

FIG. 4A is a planar diagram for explaining a detailed configuration of the magnetoresistive effect element 13 formed in the element formation region X3 of the current detection unit 10B. Further, FIGS. 4B to 4E are cross-sectional diagrams each illustrating a portion of the current detection unit 10B. Note that FIG. 4A illustrates a plurality of magnetoresistive effect films MR3 constituting the magnetoresistive effect element 13 and the upper wiring line patterns 61UB and 62UB disposed above the magnetoresistive effect films MR3, and omits other components.

As illustrated in FIG. 4A, the magnetoresistive effect element 13 may include a plurality of magnetoresistive effect films MR3 arranged in the Y-axis direction. The plurality of magnetoresistive effect films MR3 may be coupled to each other in series, and each extend in the W-axis direction inclined with respect to both of the X-axis direction and the Y-axis direction. Thus, the plurality of magnetoresistive effect films MR3 may each have a shape anisotropy in the W-axis direction. Each of the plurality of magnetoresistive effect films MR3 includes a first end part 13A, a second end part 13B, and an intermediate part 13C between the first end part 13A and the second end part 13B. Note that the first end part 13A and the second end part 13B may be portions that respectively include a first end 13AT and a second end 13BT of the magnetoresistive effect film MR3 that are opposite to each other in the W-axis direction. Further, in FIG. 4A, an arrow with a reference sign JS33 indicates a magnetization direction of a magnetization free layer S33 (described later) in an initial state in each magnetoresistive effect film MR3. The direction of the magnetization JS33 of the magnetization free layer S33 in the initial state may be substantially parallel to the W-axis direction. Further, an arrow with the reference sign JS31 in FIG. 4A indicates the direction of the magnetization JS31 of the magnetization pinned layer S31 (described later) in each magnetoresistive effect film MR3. The direction of the magnetization JS31 may be substantially parallel to the V-axis direction orthogonal to the W-axis direction. The magnetoresistive effect films MR3 may thus have sensitivity in the V-axis direction.

The upper wiring line pattern 61UB and the upper wiring line pattern 62UB of the helical coil 6 overlap the first end part 13A and the second end part 13B, respectively, in the Z-axis direction. The lower wiring line patterns 61LA to 64LA of the helical coil 6 may each overlap the first end part 13A in the Z-axis direction. Likewise, the lower wiring line patterns 65LA to 68LA of the helical coil 6 may each overlap the second end part 13B in the Z-axis direction. In a specific but non-limiting example, the upper wiring line pattern 61UB may overlap the first end 13AT in the first end part 13A in the Z-axis direction, and the upper wiring line pattern 62UB may overlap the second end 13BT in the second end part 13B in the Z-axis direction.

Figure 4B:
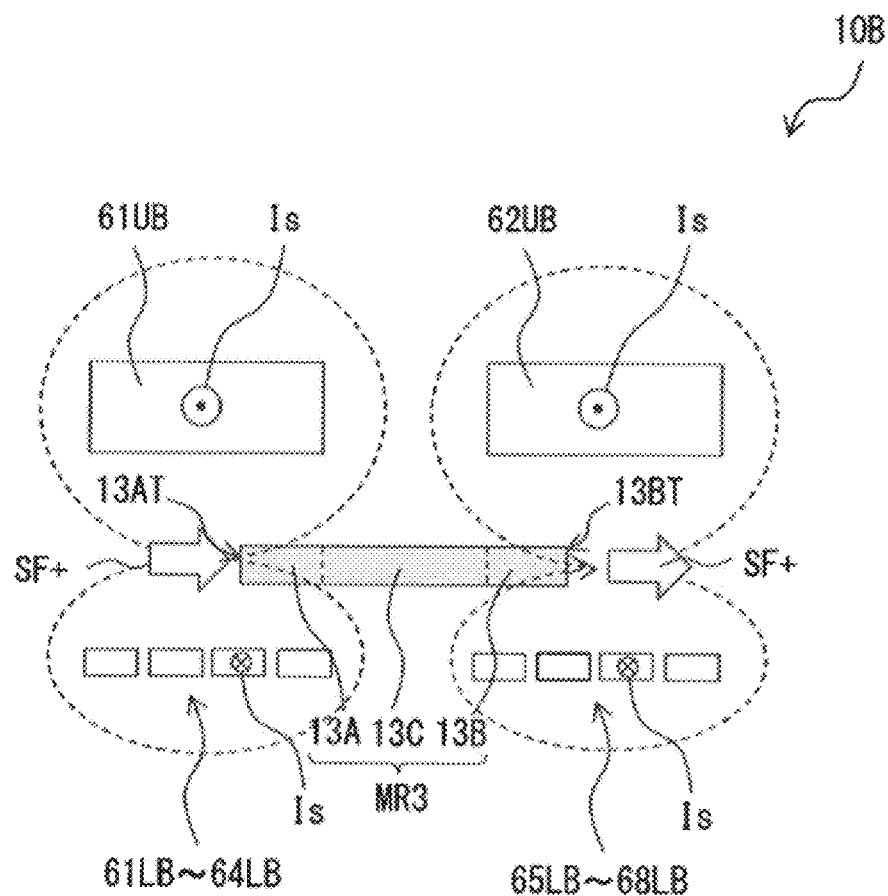
FIG. 4B is a schematic cross-sectional diagram illustrating the setting operation in the second current detection unit illustrated in FIG. 2B.
Figure 4C:
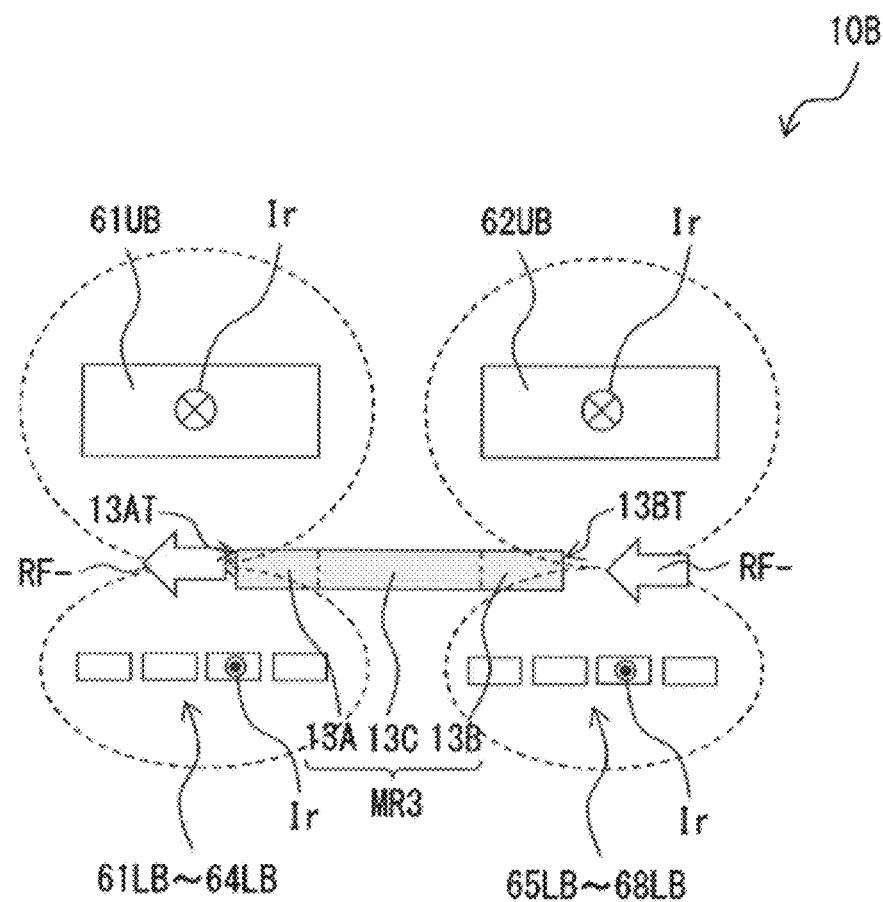
FIG. 4C is a schematic cross-sectional diagram illustrating the resetting operation in the second current detection unit illustrated in FIG. 2B.
Figure 4D:
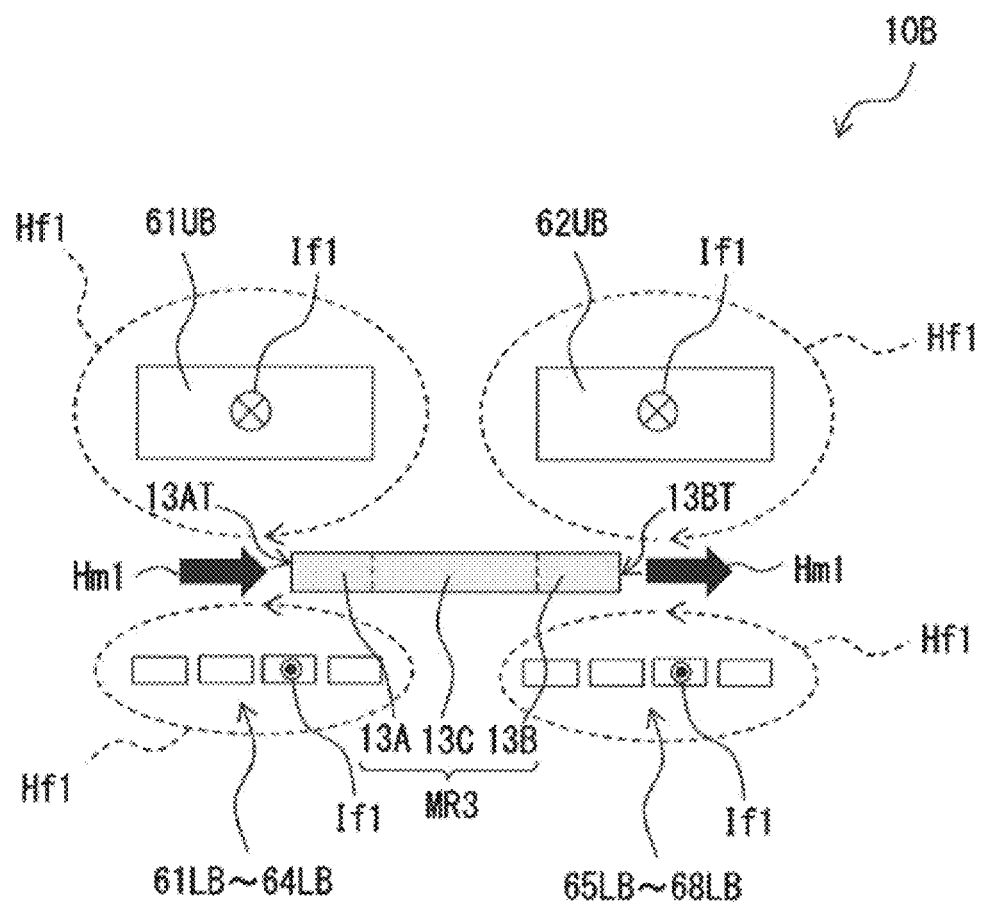
FIG. 4D is a first schematic cross-sectional diagram illustrating the current detection operation in the second current detection unit illustrated in FIG. 2B.
Figure 4D:
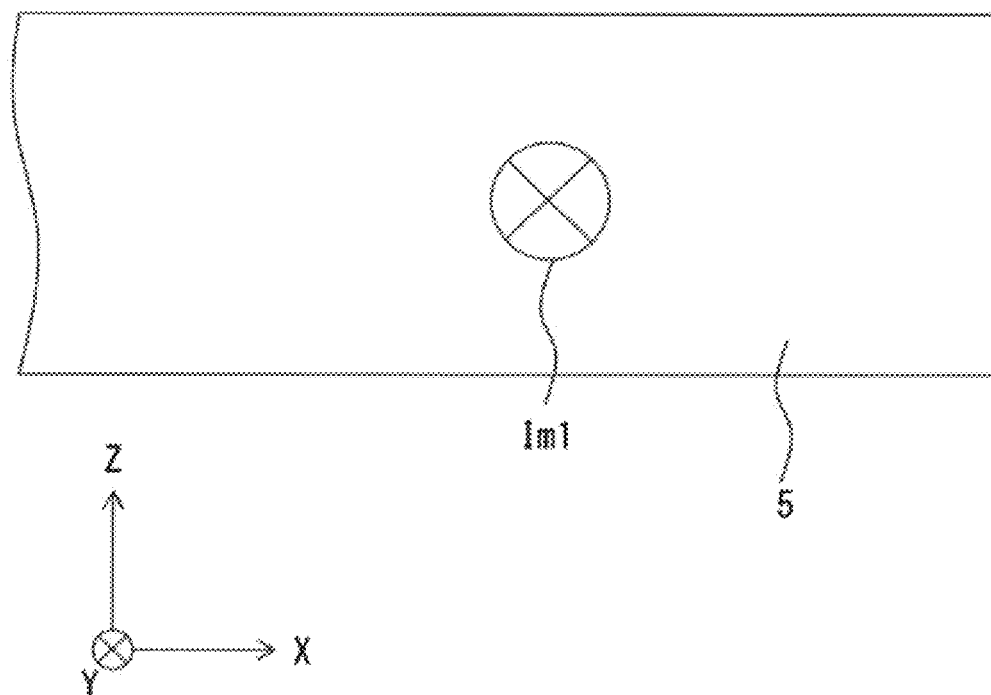
Figure 4E:
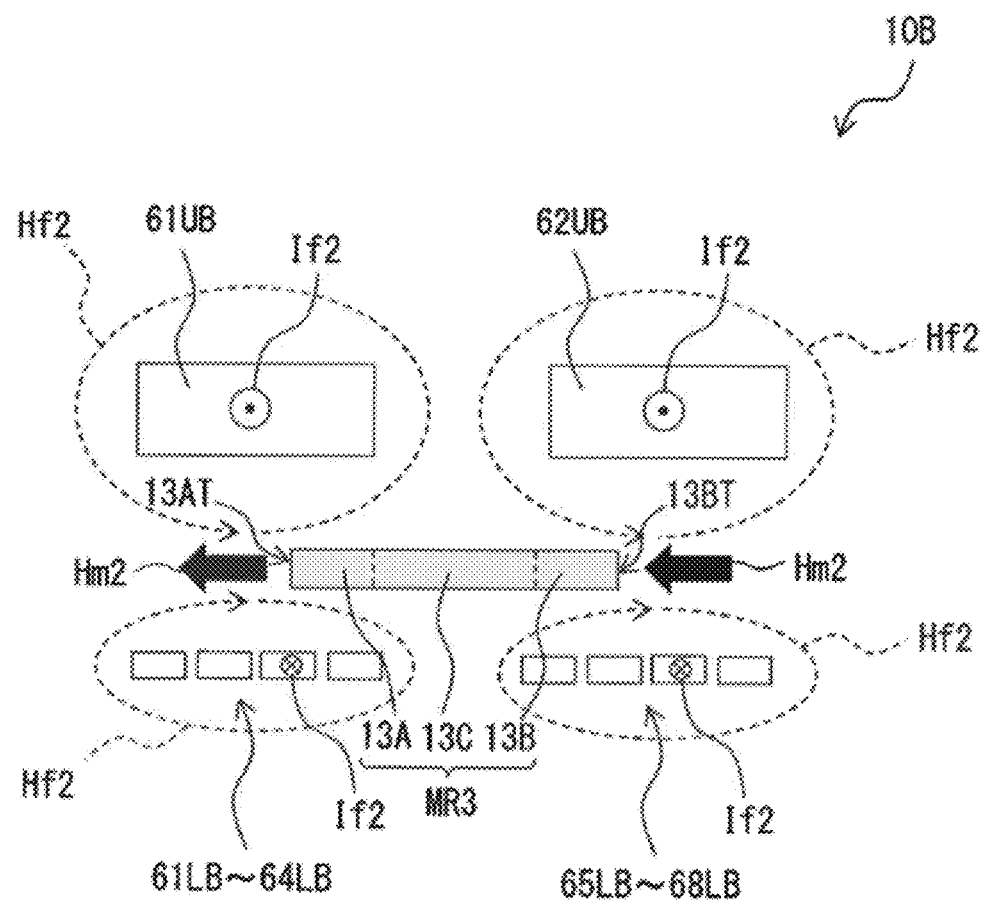
FIG. 4E is a second schematic cross-sectional diagram illustrating the current detection operation in the second current detection unit illustrated in FIG. 2B.
Figure 4E:
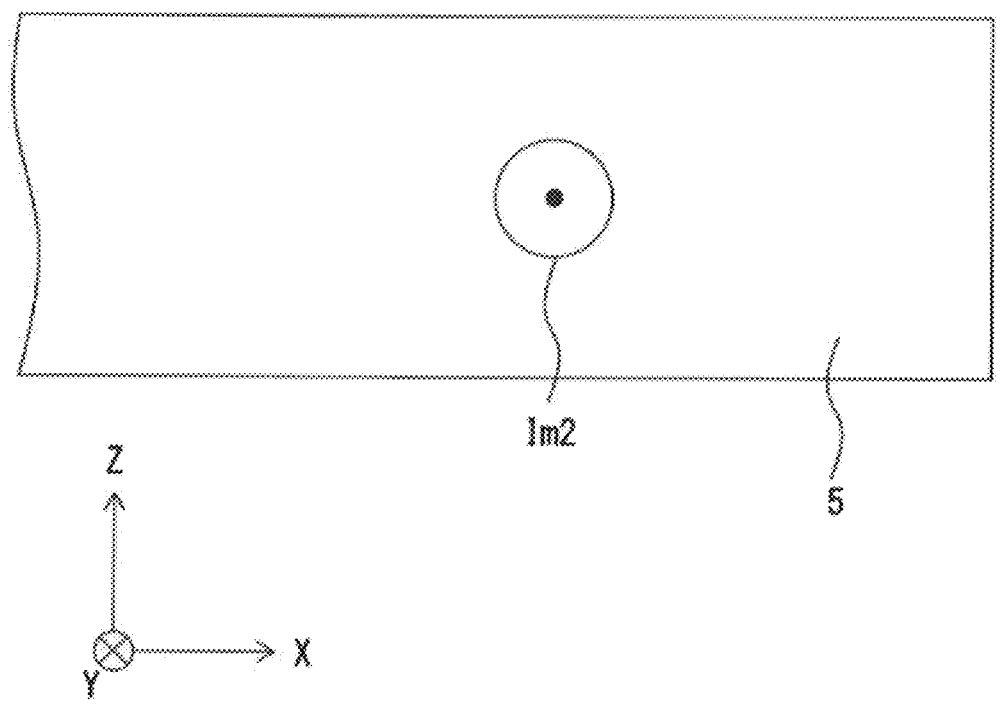

Accordingly, in the current detection unit 10B, as illustrated in FIGS. 4A and 4B, supplying the helical coil 6 with the setting current Is causes the setting magnetic field SF+ in the +X direction to be applied to the magnetoresistive effect film MR3. As illustrated in FIG. 4C, supplying the helical coil 6 with the resetting current Ir causes the resetting magnetic field RF− in the −X direction to be applied to the magnetoresistive effect film MR3. Further, as illustrated in FIG. 4D, in a case where the signal current Im1 in the +Y direction flows through the bus 5, the signal magnetic field Hm1 in the +X direction may be applied to the magnetoresistive effect film MR3. In this case, supplying the helical coil 6 with the feedback current If1 may cause the feedback magnetic field Hf1 in the −X direction to be applied to the magnetoresistive effect film MR3 to cancel out the signal magnetic field Hm1. Further, as illustrated in FIG. 4E, in a case where the signal current Im2 in the −Y direction flows through the bus 5, the signal magnetic field Hm2 in the −X direction may be applied to the magnetoresistive effect film MR3. In this case, supplying the helical coil 6 with the feedback current If2 may cause the feedback magnetic field Hf2 in the +X direction to be applied to the magnetoresistive effect film MR3 to cancel out the signal magnetic field Hm2.

[Magnetoresistive Effect Element 12]

Figure 4F:
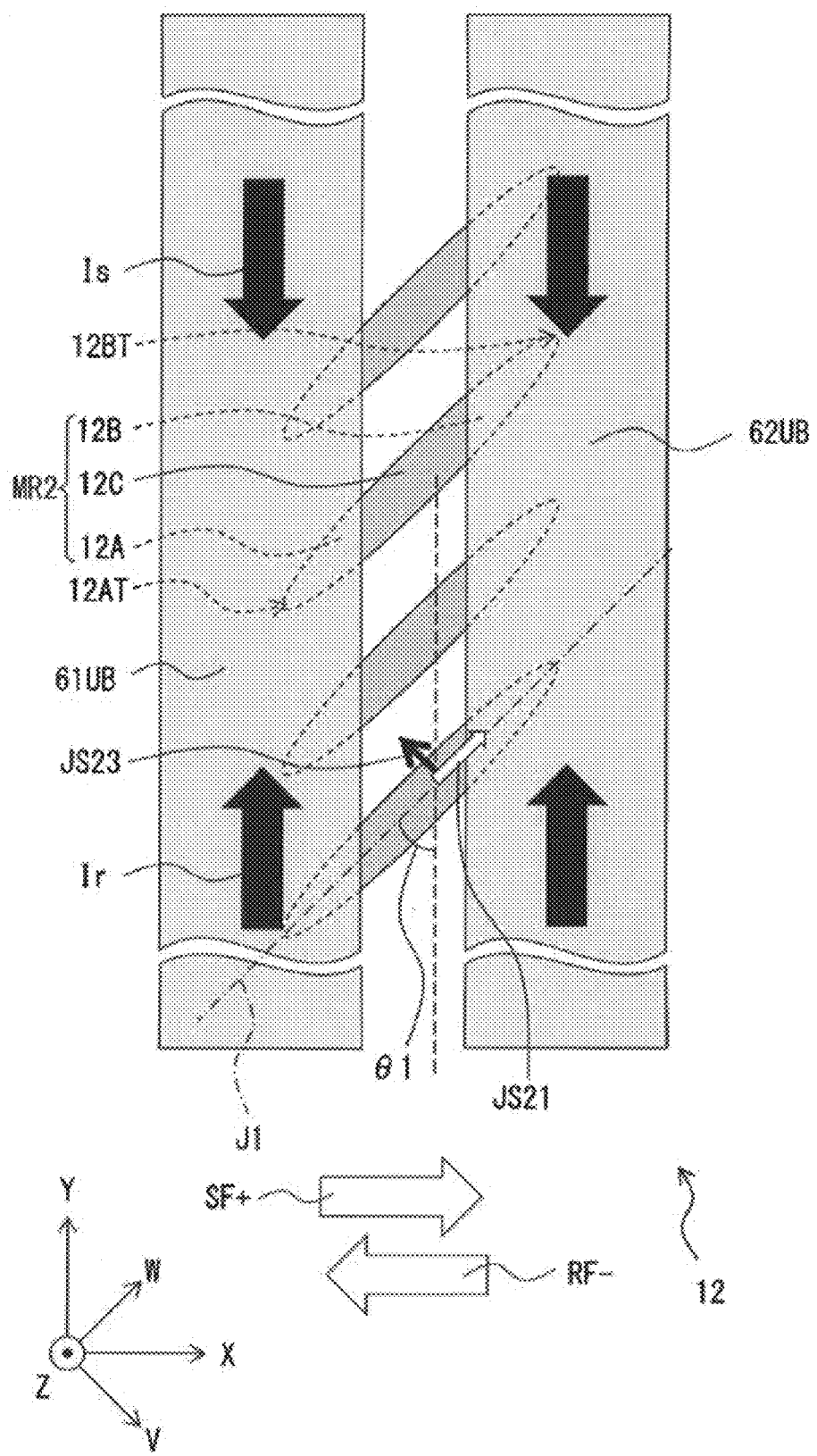
FIG. 4F is a planar diagram for explaining a detailed configuration of a second magnetoresistive effect element formed in a second element formation region illustrated in FIG. 2B.

FIG. 4F is a planar diagram for explaining a detailed configuration of the magnetoresistive effect element 12 formed in the element formation region X2. Note that FIG. 4F illustrates a plurality of magnetoresistive effect films MR2 constituting the magnetoresistive effect element 12 and the upper wiring line patterns 61UB and 62UB disposed above the magnetoresistive effect films MR2, and omits other components.

As illustrated in FIG. 4F, the magnetoresistive effect element 12 may include a plurality of magnetoresistive effect films MR2 arranged in the Y-axis direction. The plurality of magnetoresistive effect films MR2 may be coupled to each other in series, and each extend in the W-axis direction inclined with respect to both of the X-axis direction and the Y-axis direction. Thus, the plurality of magnetoresistive effect films MR2 may each have a shape anisotropy in the W-axis direction. Each of the plurality of magnetoresistive effect films MR2 includes a first end part 12A, a second end part 12B, and an intermediate part 12C between the first end part 12A and the second end part 12B. Note that the first end part 12A and the second end part 12B may be portions that respectively include a first end 12AT and a second end 12BT of the magnetoresistive effect film MR2 that are opposite to each other in the W-axis direction. Further, in FIG. 4F, an arrow with a reference sign JS23 indicates a magnetization direction of a magnetization free layer S23 (described later) in an initial state in each magnetoresistive effect film MR2. The direction of the magnetization JS23 of the magnetization free layer S23 in the initial state may be substantially parallel to the W-axis direction. Further, an arrow with the reference sign JS21 in FIG. 4F indicates the direction of the magnetization JS21 of the magnetization pinned layer S21 (described later) in each magnetoresistive effect film MR2. The direction of the magnetization JS21 may be substantially parallel to the V-axis direction orthogonal to the W-axis direction. The magnetoresistive effect films MR2 may thus have sensitivity in the V-axis direction.

The upper wiring line pattern 61UB and the upper wiring line pattern 62UB of the helical coil 6 overlap the first end part 12A and the second end part 12B, respectively, in the Z-axis direction. The lower wiring line patterns 61LA to 64LA of the helical coil 6 may each overlap the first end part 12A in the Z-axis direction. Likewise, the lower wiring line patterns 65LA to 68LA of the helical coil 6 may each overlap the second end part 12B in the Z-axis direction. In a specific but non-limiting example, the upper wiring line pattern 61UB may overlap the first end 12AT in the first end part 12A in the Z-axis direction, and the upper wiring line pattern 62UB may overlap the second end 12BT in the second end part 12B in the Z-axis direction. Accordingly, in the magnetoresistive effect element 12, as in the magnetoresistive effect element 13, supplying the helical coil 6 with the setting current Is causes the setting magnetic field SF+ in the +X direction to be applied to the magnetoresistive effect film MR2. Further, supplying the helical coil 6 with the resetting current Ir causes the resetting magnetic field RF− in the −X direction to be applied to the magnetoresistive effect film MR2.

[Bus 5]

The bus 5 may be a conductor extending in, for example, the Y-axis direction, and is configured to be supplied with a signal current Im (Im1, Im2) to be detected by the current detection apparatus 100. A constituent material of the bus 5 may include a highly electrically conductive material such as Cu (copper), for example. An alloy containing Fe (iron) or Ni (nickel), or stainless steel may also be used as a constituent material of the bus 5. A signal current Im1 flowing through the inside of the bus 5 in, for example, the +Y direction, enables the bus 5 to generate a signal magnetic field Hm1 around the bus 5. In this case, the generated signal magnetic field Hm1 is applied to the magnetoresistive effect elements 11 to 14 in the +X direction. A signal current Im2 flowing through the inside of the bus 5 in the −Y direction generates a signal magnetic field Hm2 to be applied to the magnetoresistive effect elements 11 to 14 in the −X direction.

[Helical Coil 6]

Figure 5A:
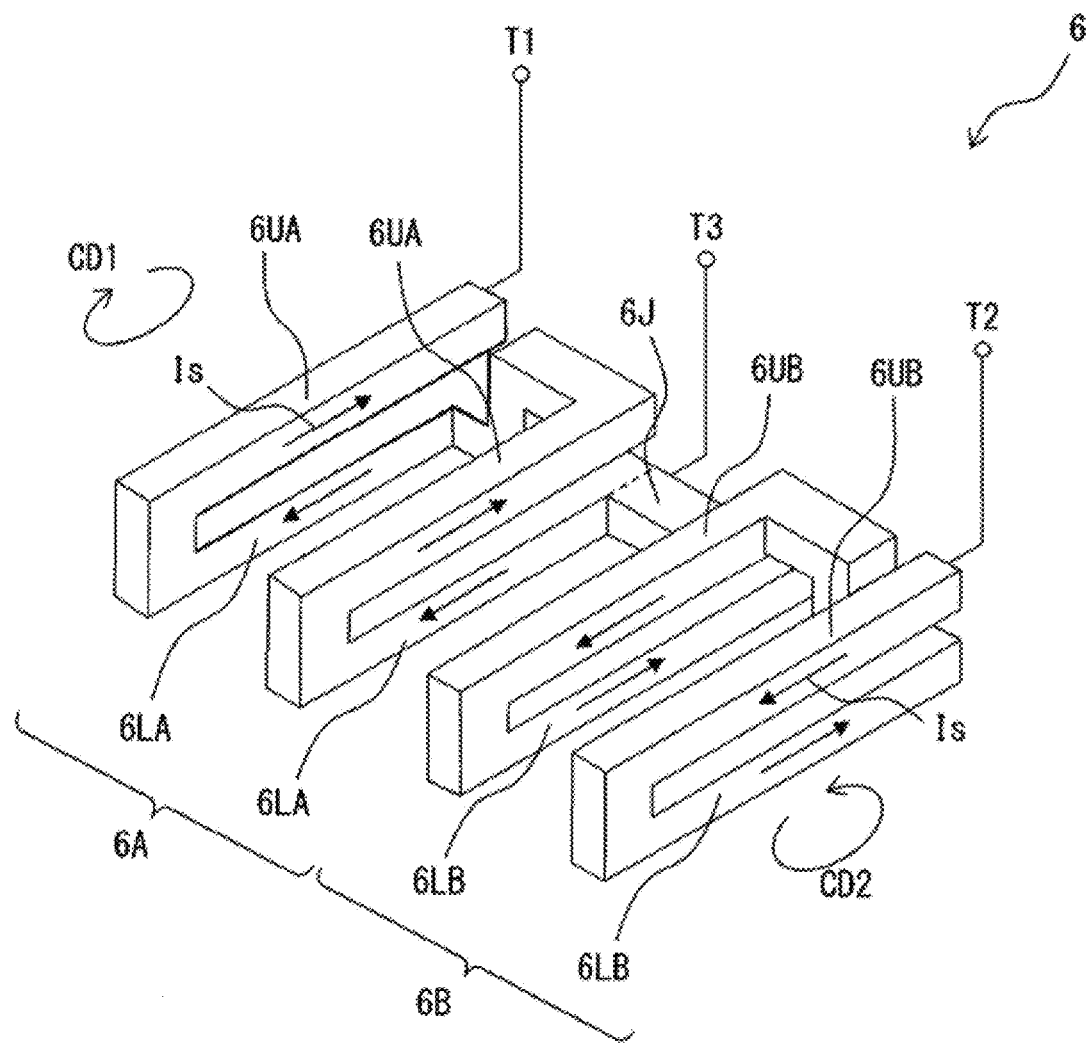
FIG. 5A is a first enlarged schematic perspective view of a portion of a helical coil.
Figure 5B:
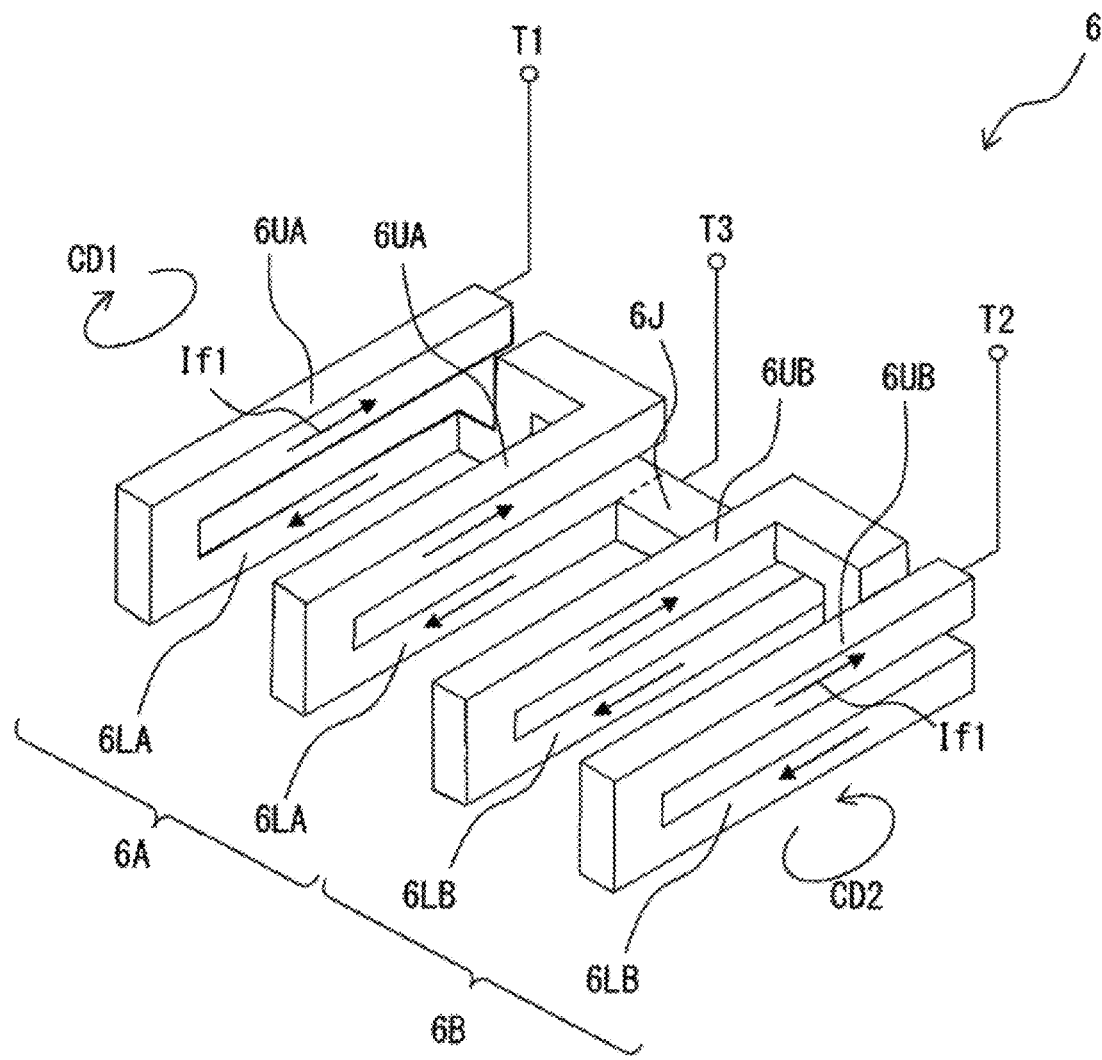
FIG. 5B is a second enlarged schematic perspective view of the portion of the helical coil.

FIGS. 5A and 5B are enlarged schematic perspective views of a portion of the helical coil 6. As already described, the helical coil 6 may include the coil part 6A and the coil part 6B. As illustrated in FIGS. 5A and 5B, the coil part 6A may be wound around the magnetoresistive effect elements 11 and 14 in a first winding direction CD1 while extending along the X-axis direction, for example. The coil part 6B may be wound around the magnetoresistive effect elements 13 and 12 in a second winding direction CD2 opposite to the first winding direction CD1 while extending along the X-axis direction. A first end of the coil part 6A and a first end of the coil part 6A may be coupled to each other via a coupling part 6J. A terminal T3 may be coupled to the coupling part 6J. The terminal T3 may be a frame ground (FG), for example. A terminal T1 may be coupled to a second end of the coil part 6A, and a terminal T2 may be coupled to a second end of the coil part 6B. It is to be noted that FIGS. 5A and 5B illustrate an example in which two current detection units 10A each corresponding to the coil part 6A and two current detection units 10B each corresponding to the coil part 6B are continuous. Further, in FIGS. 5A and 5B, the two upper wiring line patterns 61UA and 62UA are simplified into a single upper wiring line 6UA, the eight lower wiring line patterns 61LA to 68LA are simplified into a single lower wiring line 6LA, the two upper wiring line patterns 61UB and 62UB are simplified into a single upper wiring line 6UB, and the eight lower wiring line patterns 61LB to 68LB are simplified into a single lower wiring line 6LB.

The helical coil 6 may be an electrical wiring line surrounding the magnetoresistive effect elements 11 to 14 while being electrically insulated from each of the magnetoresistive effect elements 11 to 14. A constituent material of the helical coil 6 may include, for example, a highly electrically conductive material such as Cu (copper), as with the bus 5.

As illustrated in FIG. 5A, the helical coil 6 may be configured to receive supply of the setting current Is and the resetting current Ir between, for example, the terminal T1 and the terminal T2, from the power supply. Note that arrows in FIG. 5A indicate the setting current Is flowing from the terminal T2 to the terminal T1. The resetting current Ir is to flow in the opposite direction to the direction indicated by the arrows in FIG. 5A, thus flowing from the terminal T1 to the terminal T2.

As illustrated in FIG. 5B, the helical coil 6 may be configured to receive supply of the feedback currents If1 and If2 between the terminal T1 and the terminal T3 and between the terminal T2 and the terminal T3 from the power supply. Note that arrows in FIG. 5B indicate the feedback current If1 flowing from the terminal T3 to the terminal T1 and also from the terminal T3 to the terminal T2. The feedback current If2 is to flow in the opposite directions to the directions indicated by the arrows in FIG. 5B, thus flowing from the terminal T1 to the terminal T3 and also from the terminal T2 to the terminal T3.

[Magnetoresistive Effect Films MR1 to MR4]

The magnetoresistive effect films MR1 and MR3 may each have a resistance value that decreases upon application of a signal magnetic field in the +V direction and increases upon application of a signal magnetic field in the −V direction. The magnetoresistive effect films MR2 and MR4 may each have a resistance value that increases upon application of a signal magnetic field in the +V direction and decreases upon application of a signal magnetic field in the −V direction.

Figure 6A:
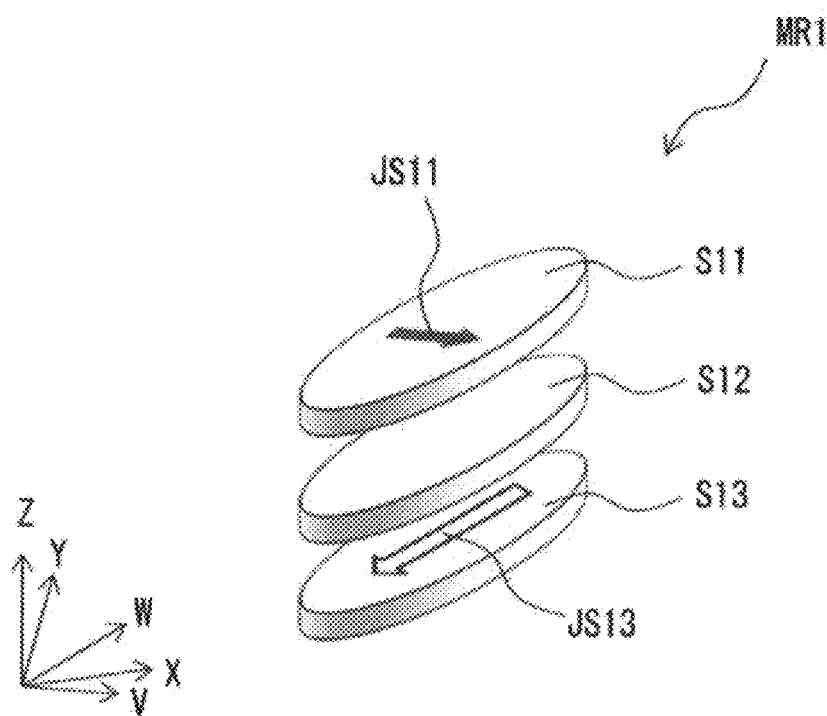
FIG. 6A is an exploded perspective diagram illustrating a stacked structure of the first magnetoresistive effect film illustrated in FIG. 3A.
Figure 6B:
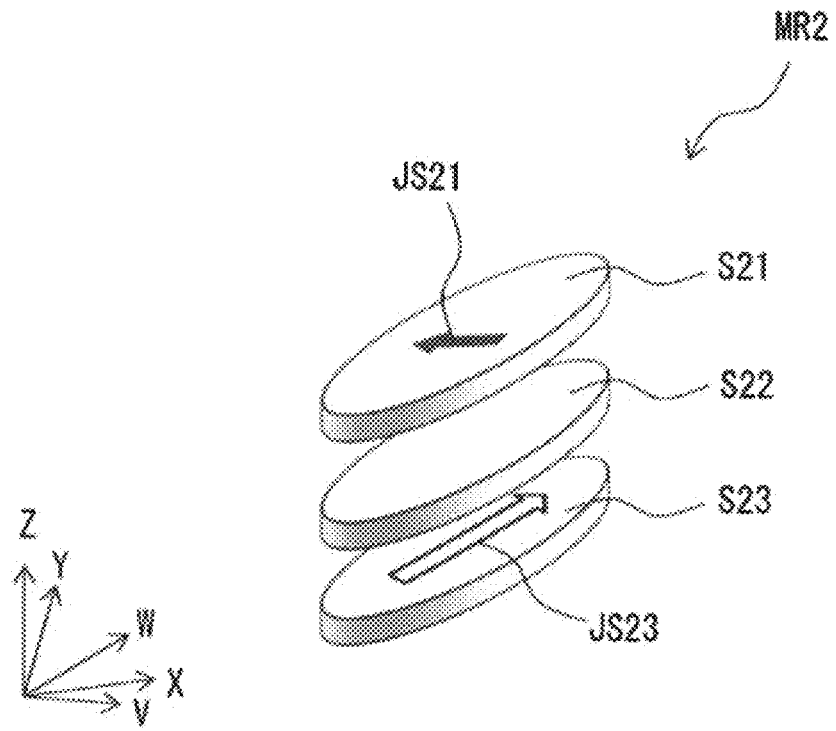
FIG. 6B is an exploded perspective diagram illustrating a stacked structure of a second magnetoresistive effect film illustrated in FIG. 4C.
Figure 6C:
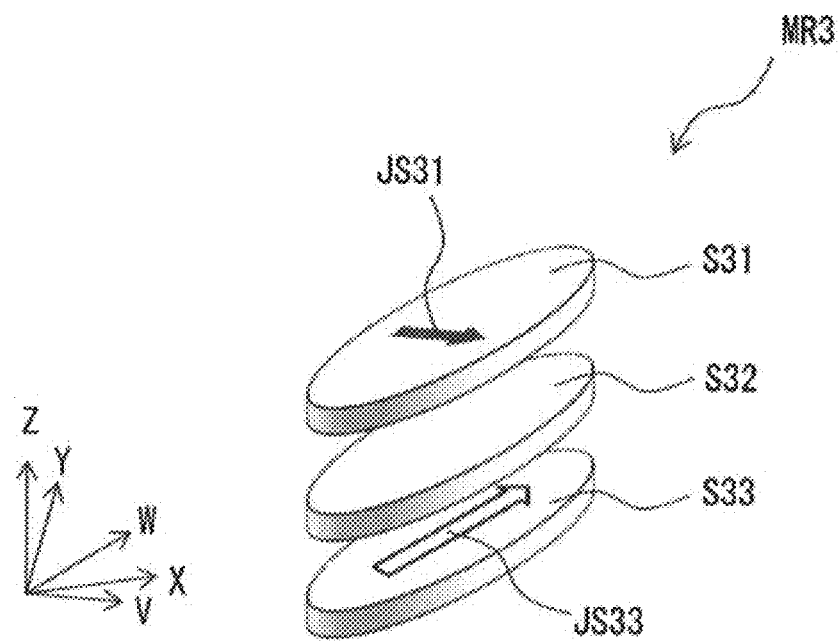
FIG. 6C is an exploded perspective diagram illustrating a stacked structure of a third magnetoresistive effect film illustrated in FIG. 4B.
Figure 6D:
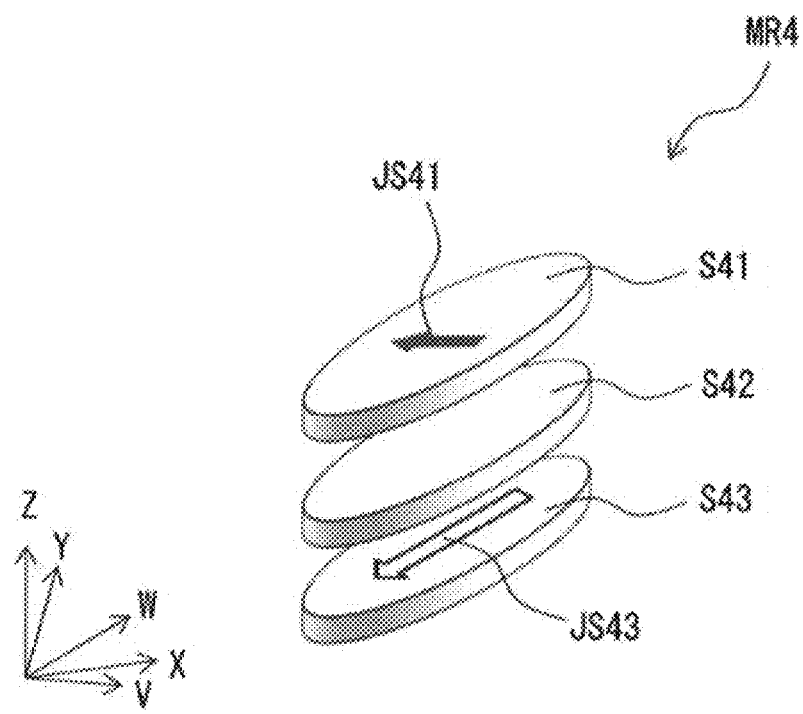
FIG. 6D is an exploded perspective diagram illustrating a stacked structure of a fourth magnetoresistive effect film illustrated in FIG. 4A.

FIG. 6A is an exploded perspective diagram illustrating a stacked structure of the magnetoresistive effect film MR1. FIG. 6B is an exploded perspective diagram illustrating a stacked structure of the magnetoresistive effect film MR2. FIG. 6C is an exploded perspective diagram illustrating a stacked structure of the magnetoresistive effect film MR3. FIG. 6D is an exploded perspective diagram illustrating a stacked structure of the magnetoresistive effect film MR4.

As illustrated in FIGS. 6A to 6D, respectively, the magnetoresistive effect films MR1 to MR4 may each have a spin-valve structure including a plurality of stacked functional films including magnetic layers. In a specific but non-limiting example, as illustrated in FIG. 6A, the magnetoresistive effect film MR1 may have a configuration in which the magnetization pinned layer S11, an intermediate layer S12, and the magnetization free layer S13 are stacked in order in the Z-axis direction. The magnetization pinned layer S11 may have the magnetization JS11 pinned in a +V direction. The intermediate layer S12 may be a nonmagnetic body. The magnetization free layer S13 may have the magnetization JS13 that varies depending on magnetic flux density of the signal magnetic field. Each of the magnetization pinned layer S11, the intermediate layer S12, and the magnetization free layer S13 may be a thin film that extends in an X-Y plane. Accordingly, the orientation of the magnetization JS13 of the magnetization free layer S13 may be rotatable in the X-Y plane.

As illustrated in FIG. 6B, the magnetoresistive effect film MR2 may have a configuration in which the magnetization pinned layer S21, an intermediate layer S22, and the magnetization free layer S23 are stacked in order in the Z-axis direction. The magnetization pinned layer S21 may have the magnetization JS21 pinned in a −V direction. The intermediate layer S22 may be a nonmagnetic body. The magnetization free layer S23 may have the magnetization JS23 that varies depending on magnetic flux density of the signal magnetic field. Each of the magnetization pinned layer S21, the intermediate layer S22, and the magnetization free layer S23 may be a thin film that extends in the X-Y plane. Accordingly, the orientation of the magnetization JS23 of the magnetization free layer S23 may be rotatable in the X-Y plane.

As illustrated in FIG. 6C, the magnetoresistive effect film MR3 may have a configuration in which the magnetization pinned layer S31, an intermediate layer S32, and the magnetization free layer S33 are stacked in order in the Z-axis direction. The magnetization pinned layer S31 may have the magnetization JS31 pinned in the +V direction. The intermediate layer S32 may be a nonmagnetic body. The magnetization free layer S33 may have the magnetization JS33 that varies depending on magnetic flux density of the signal magnetic field. Each of the magnetization pinned layer S31, the intermediate layer S32, and the magnetization free layer S33 may be a thin film that extends in the X-Y plane. Accordingly, the orientation of the magnetization JS33 of the magnetization free layer S33 may be rotatable in the X-Y plane.

As illustrated in FIG. 6D, the magnetoresistive effect film MR4 may have a configuration in which the magnetization pinned layer S41, an intermediate layer S42, and the magnetization free layer S43 are stacked in order in the Z-axis direction. The magnetization pinned layer S41 may have the magnetization JS41 pinned in the −V direction. The intermediate layer S42 may be a nonmagnetic body. The magnetization free layer S43 may have the magnetization JS43 that varies depending on magnetic flux density of the signal magnetic field. Each of the magnetization pinned layer S41, the intermediate layer S42, and the magnetization free layer S43 may be a thin film that extends in the X-Y plane. Accordingly, the orientation of the magnetization JS43 of the magnetization free layer S43 may be rotatable in the X-Y plane.

As described above, the magnetization pinned layers S11 and S31 in the magnetoresistive effect films MR1 and MR3 may have their respective magnetizations JS11 and JS31 pinned in the +V direction, whereas the magnetization pinned layers S21 and S41 in the magnetoresistive effect films MR2 and MR4 may have their respective magnetizations JS21 and JS41 pinned in the −V direction.

Note that in the magnetoresistive effect films MR1 to MR4, the magnetization pinned layers S11, S21, S31, and S41, the intermediate layers S12, S22, S32, and S42, and the magnetization free layers S13, S23, S33, and S43 may each have a single-layer structure or a multi-layer structure including a plurality of layers.

The magnetization pinned layers S11, S21, S31, and S41 may each include a ferromagnetic material such as cobalt (Co), cobalt-iron alloy (CoFe), or cobalt-iron-boron alloy (CoFeB). Optionally, the magnetoresistive effect films MR1 to MR4 may be provided with respective antiferromagnetic layers (not illustrated) that are adjacent to the magnetization pinned layers S11, S21, S31, and S41 and located on the opposite side from the intermediate layers S12, S22, S32, and S42. Such antiferromagnetic layers may each include an antiferromagnetic material such as platinum-manganese alloy (PtMn) or iridium-manganese alloy (IrMn). In the magnetoresistive effect films MR1 to MR4, the antiferromagnetic layers may be in a state in which a spin magnetic moment in the +V direction and a spin magnetic moment in the −V direction cancel each other out completely, and may act to pin the orientations of the magnetizations JS11 and JS31 of the magnetization pinned layers S11 and S31 adjacent to the antiferromagnetic layers to the +V direction, or pin the orientations of the magnetizations JS21 and JS41 of the magnetization pinned layers S21 and S41 adjacent to the antiferromagnetic layers to the −V direction.

In a case where the spin-valve structure serves as a magnetic tunnel junction (MTJ) film, the intermediate layers S12, S22, S32, and S42 may each be a nonmagnetic tunnel barrier layer including, for example, magnesium oxide (MgO), and may each be thin enough to allow a tunnel current based on quantum mechanics to pass therethrough. The tunnel barrier layer including MgO may be obtainable by a process such as sputtering using a target including MgO, oxidation treatment of a thin film of magnesium (Mg), or a reactive sputtering of magnesium in an oxygen atmosphere. Further, an oxide or a nitride of aluminum (Al), tantalum (Ta), or hafnium (Hf), as well as MgO, may also be used to configure the intermediate layers S12, S22, S32, and S42. Note that the intermediate layers S12, S22, S32, and S42 may each include a platinum group element such as ruthenium (Ru) or gold (Au), or a nonmagnetic metal such as copper (Cu). In such a case, the spin-valve structure may serve as a giant magnetoresistive effect (GMR) film.

The magnetization free layers S13, S23, S33, and S43 may be soft ferromagnetic layers and include substantially the same materials. The magnetization free layers S13, S23, S33, and S43 may include, for example, cobalt-iron alloy (CoFe), nickel-iron alloy (NiFe), or cobalt-iron-boron alloy (CoFeB).

[Bridge Circuit 7]

Figure 7:
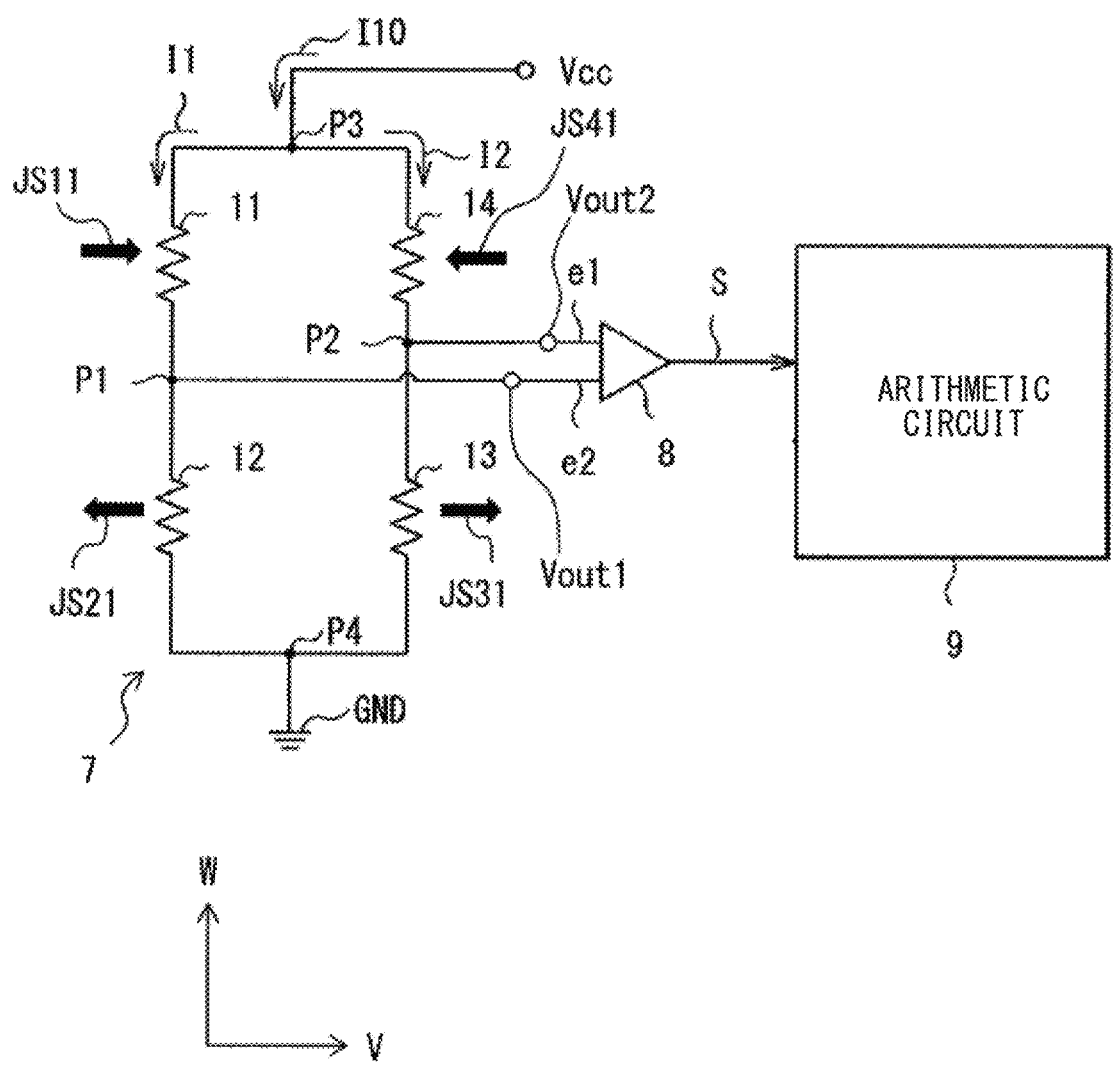
FIG. 7 is a circuit diagram of the current detection apparatus illustrated in FIG. 1.

The four magnetoresistive effect elements 11 to 14 may be bridged to form a bridge circuit 7, as illustrated in FIG. 7. The magnetoresistive effect elements 11 to 14 may each be configured to detect a change in a signal magnetic field Hm (Hm1, Hm2) to be detected. As described above, the magnetoresistive effect elements 11 and 13 may each have a resistance value that decreases upon application of the signal magnetic field Hm1 in the +V direction and increases upon application of the signal magnetic field Hm2 in the −V direction. The magnetoresistive effect elements 12 and 14 may each have a resistance value that increases upon application of the signal magnetic field Hm1 in the +V direction and decreases upon application of the signal magnetic field Hm2 in the −V direction. Accordingly, in response to a change in the signal magnetic field Hm, the magnetoresistive effect elements 11 and 13 and the magnetoresistive effect elements 12 and 14 may output respective signals that are different in phase by 180° from each other, for example.

As illustrated in FIG. 7, the bridge circuit 7 may have a configuration in which the magnetoresistive effect elements 11 and 12 coupled in series and the magnetoresistive effect elements 13 and 14 coupled in series are coupled to each other in parallel. In a specific but non-limiting example, in the bridge circuit 7, one end of the magnetoresistive effect element 11 and one end of the magnetoresistive effect element 12 may be coupled to each other at a node P1; one end of the magnetoresistive effect element 13 and one end of the magnetoresistive effect element 14 may be coupled to each other at a node P2; another end of the magnetoresistive effect element 11 and another end of the magnetoresistive effect element 14 may be coupled to each other at a node P3; and another end of the magnetoresistive effect element 12 and another end of the magnetoresistive effect element 13 may be coupled to each other at a node P4. Here, the node P3 may be coupled to a power supply Vcc, and the node P4 may be coupled to a ground terminal GND. The node P1 may be coupled to an output terminal Vout1, and the node P2 may be coupled to an output terminal Vout2. The output terminal Vout1 and the output terminal Vout2 may each be coupled to an input-side terminal of a difference detector 8, for example. The difference detector 8 may detect a potential difference between the node P1 and the node P2 (i.e., a difference between voltage drops occurring at the magnetoresistive effect element 11 and the magnetoresistive effect element 14) when a voltage is applied between the node P3 and the node P4, and may output the detected potential difference to an arithmetic circuit 9 as a difference signal S.

In FIG. 7, arrows with reference signs JS11 and JS31 schematically indicate orientations of the magnetizations JS11 and JS31 of the magnetization pinned layers S11 and S31 in the magnetoresistive effect elements 11 and 13. Further, arrows with reference signs JS21 and JS41 in FIG. 7 schematically indicate orientations of the magnetizations JS21 and JS41 of the magnetization pinned layers S21 and S41 in the magnetoresistive effect elements 12 and 14. As illustrated in FIG. 7, the orientation of the magnetizations JS11 and JS31 and the orientation of the magnetizations JS21 and JS41 may be opposite to each other. In other words, FIG. 7 illustrates that the resistance value of the magnetoresistive effect element 11 and the resistance value of the magnetoresistive effect element 13 may change (e.g., increase or decrease) in the same direction in response to a change in the signal magnetic field Hm. FIG. 7 also illustrates that both the resistance value of the magnetoresistive effect element 12 and the resistance value of the magnetoresistive effect element 14 may change (decrease or increase) in a direction opposite to the direction of the change in the resistance value of each of the magnetoresistive effect elements 11 and 13 in response to the change in the signal magnetic field Hm.

A current I10 from the power supply Vcc may be divided into a current I1 and a current I2 at the node P3. The current I1 or the current I2 may be supplied to each of the magnetoresistive effect elements 11 to 14 constituting the bridge circuit 7. Signals e1 and e2 may be extracted from the nodes P1 and P2 of the bridge circuit 7, respectively. The signals e1 and e2 may flow into the difference detector 8.

[Operations and Workings of Current Detection Apparatus 100]

In the current detection apparatus 100 according to the present example embodiment, it is possible to detect changes in the signal magnetic fields generated by the signal currents Im1 and Im2 flowing through the bus 5 by calculating a potential difference V0 at the arithmetic circuit 9.

[Detecting Operation]

First, consider a state of the current detection apparatus 100 where no signal magnetic field Hm is applied. Here, respective resistance values of the magnetoresistive effect elements 11 to 14 when a current I10 is passed through the bridge circuit 7 are denoted by r1 to r4. The current I10 from the power supply Vcc may be divided into two currents, i.e., the current I1 and the current I2 at the node P3. Thereafter, the current I1 having passed through the magnetoresistive effect element 11 and the magnetoresistive effect element 12 and the current I2 having passed through the magnetoresistive effect element 14 and the magnetoresistive effect element 13 may join into one at the node P4. In such a case, a potential difference V between the node P3 and the node P4 is represented as follows.

$$V=I1*r1+I1*r2=I2*r4+I2*r3=I1*(r1+r2)=I2*(r4+r3) \quad (1)$$

Further, a potential V1 at the node P1 and a potential V2 at the node P2 are represented as follows.

$$V1=V-I1*r1$$

$$V2=V-I2*r4$$

Accordingly, the potential difference V0 between the node P1 and the node P2 is as follows.

$$V0=V2-V1=(V-I2*r4)-(V-I1*r1)=I1*r1-I2*r4 \quad (2)$$

Here, from the equation (1), the following equation holds.

$$V0=r1/(r1+r2) \times V - r4/(r4+r3) \times V = \{r1/(r1+r2) - r4/(r4+r3)\} \times V \quad (3)$$

For the bridge circuit 7, it is possible to determine an amount of change in resistance by measuring the potential difference V0 between the node P2 and the node P1 represented by the above equation (3) upon application of the signal magnetic field Hm. Suppose here that application of the signal magnetic field Hm results in changes of respective resistance values R1 to R4 of the magnetoresistive effect elements 11 to 14 by amounts of changes ΔR1 to ΔR4, respectively. In other words, suppose that the respective resistance values R1 to R4 of the magnetoresistive effect elements 11 to 14 after application of the signal magnetic field Hm are as follows.

$$R1=r1+\Delta R1$$

$$R2=r2+\Delta R2$$

$$R3=r3+\Delta R3$$

$$R4=r4+\Delta R4$$

In this case, from the equation (3), the potential difference V0 upon application of the signal magnetic field Hm is as follows.

$$V0=\{(r1+\Delta R1)/(r1+\Delta R1+r2+\Delta R2)-(r4+\Delta R4)/(r4+\Delta R4+r3+\Delta R3)\} \times V \quad (4)$$

Because the current detection apparatus 100 may be configured to allow the resistance values R1 and R3 of the magnetoresistive effect elements 11 and 13 and the resistance values R2 and R4 of the magnetoresistive effect elements 12 and 14 to exhibit changes in opposite directions to each other, the amount of change ΔR4 and the amount of change ΔR1 may cancel each other out, and also the amount of change ΔR3 and the amount of change ΔR2 may cancel each other out. In this case, if comparison is made between before and after the application of the signal magnetic field, there is substantially no increase in denominators of respective terms of the equation (4). In contrast, an increase or a decrease appears in numerators of the respective terms because the amount of change ΔR1 and the amount of change ΔR4 always have opposite signs.

Suppose that all of the magnetoresistive effect elements 11 to 14 have exactly the same characteristics, i.e., suppose that r1=r2=r3=r4=R and that ΔR1=−ΔR2=ΔR3=−ΔR4=ΔR. In such a case, the equation (4) is expressed as follows.

$$V0=\{(R+\Delta R)/(2 \times R)-(R-\Delta R)/(2 \times R)\} \times V = (\Delta R/R) \times V$$

In such a manner, it is possible to measure the magnitudes of signal magnetic fields Hm by using the magnetoresistive effect elements 11 to 14 whose characteristic values such as ΔR/R are known, and this makes it possible to estimate the magnitudes of the signal currents Im1 and Im2 that generate the signal magnetic fields Hm.

In some embodiments, the current detection apparatus 100 may include a controller 70. The controller 70 may be a microcomputer, for example. The controller 70 may include a central processing unit (CPU) that is configured to execute a control program to carry out predetermined control processing. The controller 70 may be configured to sequentially control the magnitudes of the feedback currents If1 and If2 to generate feedback magnetic fields Hf1 and Hf2 having intensities that cancel out the signal magnetic fields Hm generated by the signal currents Im1 and Im2 flowing through the bus 5, in other words, to allow an output from the bridge circuit 7 to remain zero. In such a case, it is possible to assume the magnitudes of the feedback currents If1 and If2 to be substantially equal to those of the signal currents Im1 and Im2 flowing through the bus 5.

[Setting and Resetting Operations]

For a current detection apparatus of this kind, magnetizations of the magnetization free layers in the magnetoresistive effect elements may optionally be once aligned in a predetermined direction before performing an operation of detecting a signal magnetic field. One reason for this is that it serves to increase accuracy of the operation of detecting the signal magnetic field Hm. In a specific but non-limiting example, an external magnetic field having a known magnitude may be applied alternately in a predetermined direction and in a direction opposite thereto. Such operations will be referred to as setting and resetting operations on the magnetization of a magnetization free layer.

In the current detection apparatus 100 of the present example embodiment, the setting operation may be carried out by supplying the helical coil 6 with a setting current Is. Supplying the helical coil 6 with the setting current Is causes each of a setting magnetic field SF− and a setting magnetic field SF+ to be generated around the helical coil 6, as illustrated in FIGS. 3B and 4B, respectively. As a result, in the current detection unit 10A, it is possible to apply the setting magnetic field SF− in the −X direction to the magnetoresistive effect films MR1 and MR4 of the magnetoresistive effect elements 11 and 14. This causes the magnetizations of the magnetization free layers S13 and S43 of the magnetoresistive effect films MR1 and MR4 to be oriented in the −W direction, thus carrying out the setting operation. In the current detection unit 10B, it is possible to apply the setting magnetic field SF+ in the +X direction to the magnetoresistive effect films MR2 and MR3 of the magnetoresistive effect elements 12 and 13. This causes the magnetizations of the magnetization free layers S23 and S33 of the magnetoresistive effect films MR2 and MR3 to be oriented in the +W direction, thus carrying out the setting operation. Further, the resetting operation may be carried out by supplying the helical coil 6 with a resetting current Ir. Supplying the helical coil 6 with the resetting current Ir causes each of a resetting magnetic field RF+ and a resetting magnetic field RF− to be generated around the helical coil 6, as illustrated in FIGS. 3C and 4C, respectively. As a result, in the current detection unit 10A, it is possible to apply the resetting magnetic field RF+ in the +X direction to the magnetoresistive effect films MR1 and MR4 of the magnetoresistive effect elements 11 and 14. This causes the magnetizations of the magnetization free layers S13 and S43 of the magnetoresistive effect films MR1 and MR4 to be oriented in the +W direction, thus carrying out the resetting operation. In the current detection unit 10B, it is possible to apply the resetting magnetic field RF− in the −X direction to the magnetoresistive effect films MR2 and MR3 of the magnetoresistive effect elements 12 and 13. This causes the magnetizations of the magnetization free layers S23 and S33 of the magnetoresistive effect films MR2 and MR3 to be oriented in the −W direction, thus carrying out the resetting operation.

[Example Effects of Current Detection Apparatus 100]

In the present example embodiment, the upper wiring line pattern 61UA and the upper wiring line pattern 62UA of the helical coil 6 overlap the first end part 11A and the second end part 11B, respectively, in the Z-axis direction in the magnetoresistive effect element 11, for example. As a result, the intensities (absolute values) of the setting magnetic field SF− and the resetting magnetic field RF+ to be applied to the first end part 11A and the intensities (absolute values) of the setting magnetic field SF− and the resetting magnetic field RF+ to be applied to the second end part 11B may be higher than the intensities (absolute values) of the setting magnetic field SF− and the resetting magnetic field RF+ to be applied to the intermediate part 11C. This enables the setting magnetic field SF and the resetting magnetic field RF generated by the helical coil 6 to be effectively applied to the first end part 11A and the second end part 11B of the magnetoresistive effect film MR1. The direction of the magnetization JS13 of the magnetization free layer S13 is thereby evenly and sufficiently set and reset throughout the magnetoresistive effect film MR1. Similar workings are also obtainable for the magnetoresistive effect elements 12 to 14. Consequently, according to the current detection apparatus 100 of the present example embodiment, it is possible to achieve high accuracy of current detection even in a case where dimensions thereof are reduced.

Furthermore, in some embodiments, instead of using a conductor that is wide enough to overlap the whole of each magnetoresistive effect film, the helical coil 6 may be provided that overlaps only respective portions (the first end parts 11A to 14A and the second end parts 11B to 14B) of the magnetoresistive effect films. This allows, for example, the upper wiring line patterns 61UA, 61UB, 62UA and 62UB to be small in width. This consequently allows a value of a current that is to be supplied to the helical coil 6 in order to obtain the predetermined setting magnetic fields SF and resetting magnetic fields RF and the predetermined feedback magnetic fields Hf1 and Hf2 to be kept low.

Further, in some embodiments, a branch part may be formed in some sections of the helical coil 6. In a specific but non-limiting example, the upper wiring line 6UA may be configured by the two upper wiring line patterns 61UA and 62UA coupled to each other in parallel, and the lower wiring line 6LA may be configured by the eight lower wiring line patterns 61LA to 68LA coupled to each other in parallel. Such embodiments make it possible to arrange a larger number of magnetoresistive effect films MR1 to MR4 than the number of turns of the helical coil 6 in the Y-axis direction, as compared with a case of using a helical coil that includes no such branch part. This helps to achieve higher integration.

Further, in some embodiments, the helical coil 6 may be used in which the coil part 6A and the coil part 6B wound in opposite directions to each other as illustrated in FIGS. 5A and 5B are integrated into one. This makes it possible to form within a narrower region the plurality of magnetoresistive effect elements 11 to 14 including the magnetoresistive effect films MR1 to MR4, the magnetoresistive effect films MR1 to MR4 including two pairs of magnetoresistive effect films that are opposite to each other in terms of the setting/resetting direction for the magnetization directions of the respective magnetization free layers. Furthermore, the use of the single helical coil 6 including the integral coil parts 6A and 6B makes it possible to reduce the number of terminals for power feeding, as compared with a case of providing two helical coils. This helps to achieve higher integration.

Further, in some embodiments, the setting/resetting direction for the magnetization free layers S13 and S43 of the magnetoresistive effect films MR1 and MR4 and the setting/resetting direction for the magnetization free layers S23 and S33 of the magnetoresistive effect films MR2 and MR3 may be opposite to each other. By configuring the bridge circuit 7 with the magnetoresistive effect elements that include pairs of magnetoresistive effect films in which the magnetization directions of the respective magnetization free layers upon setting or resetting are opposite to each other, it is possible to reduce noise resulting from an unwanted disturbance magnetic field and reduce error resulting from stress distortion.

2. Modification Examples

The technology has been described above with reference to the example embodiment. However, the technology is not limited thereto, and may be modified in a variety of ways. For example, in the foregoing example embodiment, four magnetoresistive effect elements are used to form a full-bridge circuit. However, in some embodiments of the disclosure, for example, two magnetoresistive effect elements may be used to form a half-bridge circuit. Further, the plurality of magnetoresistive effect films may be identical with each other or different from each other in shape and dimensions. The dimensions of components and the layouts of the components are merely illustrative, and are not limited thereto.

Figure 8:
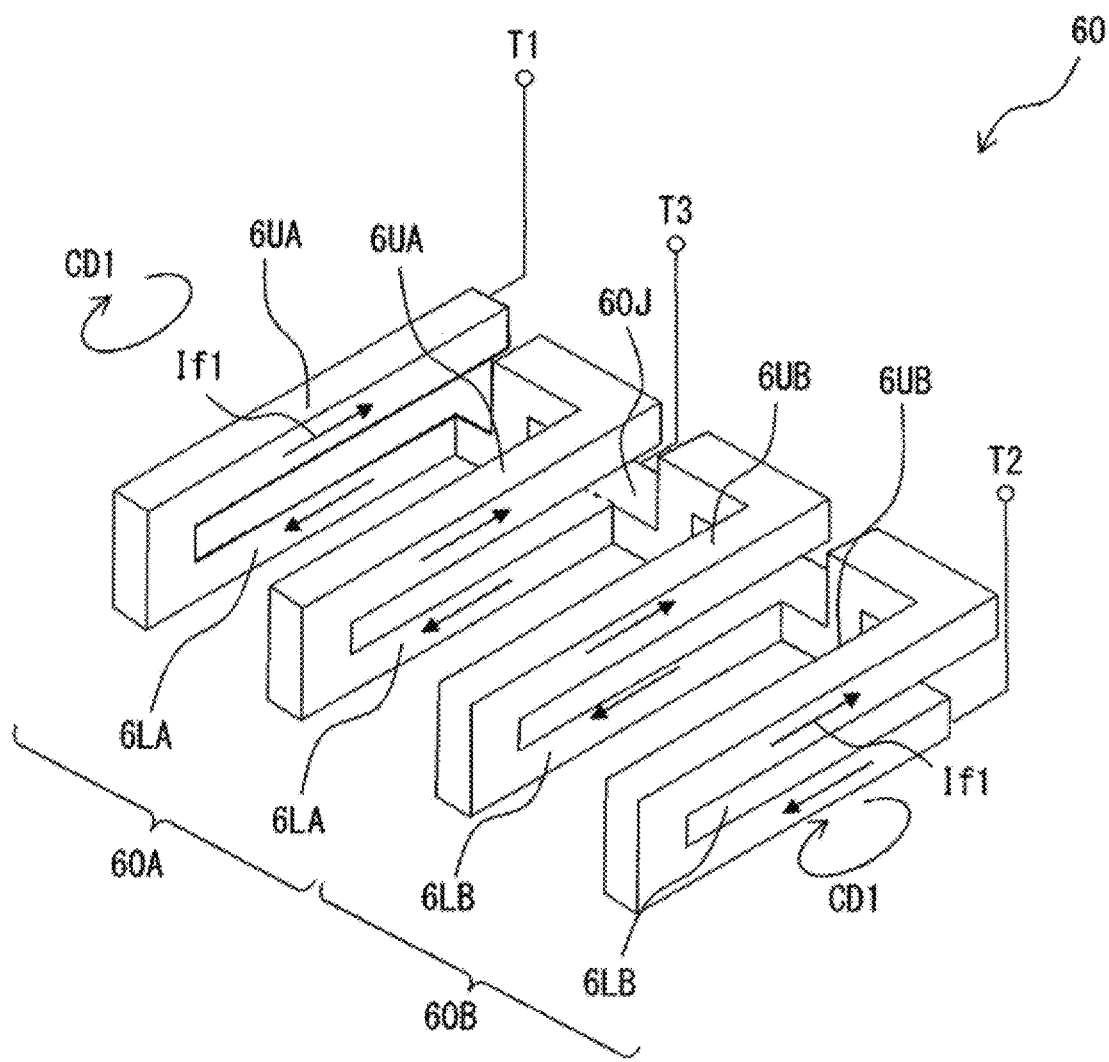
FIG. 8 is a first enlarged schematic perspective view of a portion of a helical coil according to one modification example.
Figure 9:
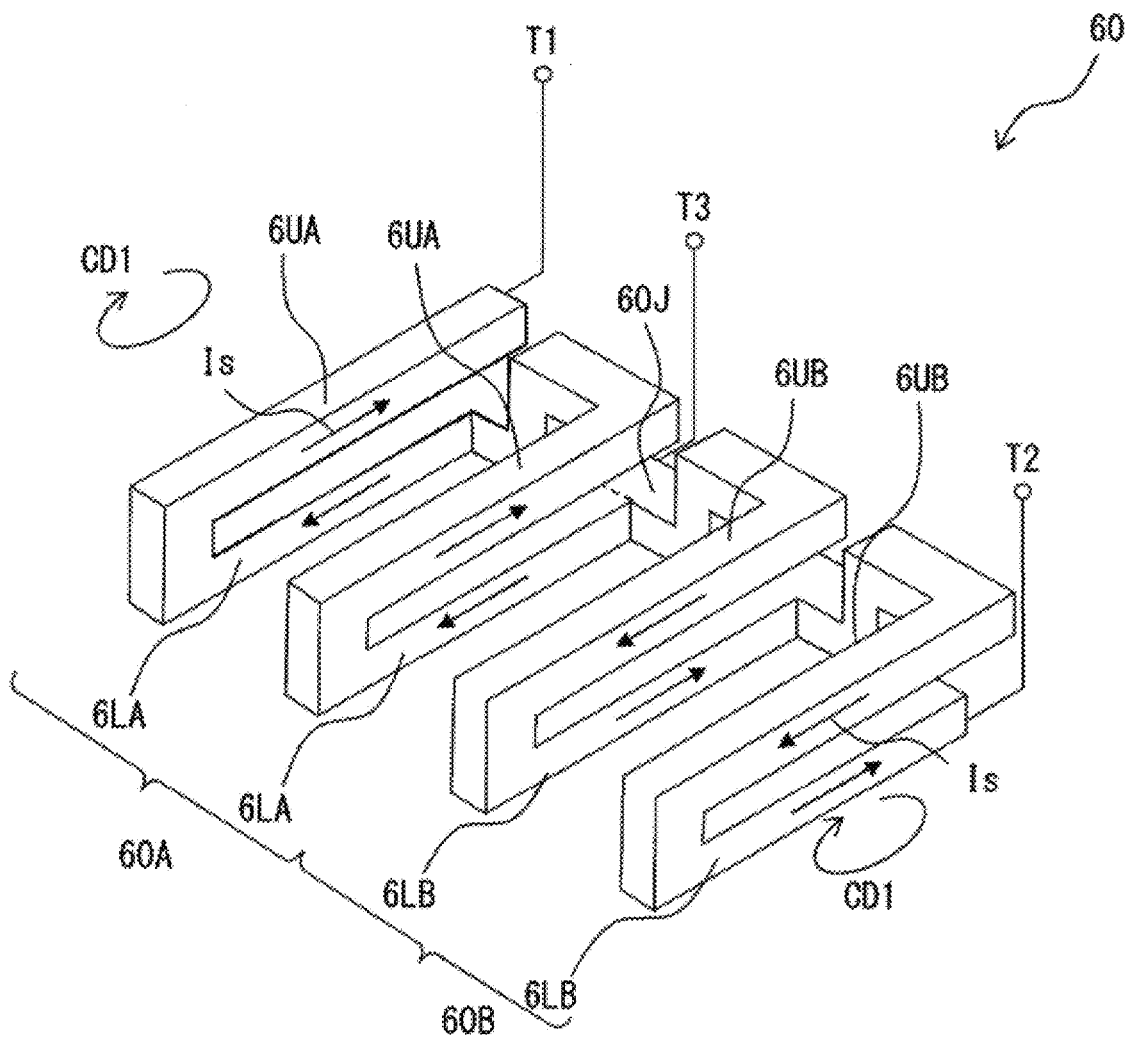
FIG. 9 is a second enlarged schematic perspective view of the portion of the helical coil according to the modification example.

In the foregoing example embodiment, the current detection apparatus including the helical coil 6 whose winding direction reverses at an intermediate point along the coil has been described; however, the technology is not limited thereto. In some embodiments of the disclosure, the current detection apparatus may include a helical coil wound in one direction, like a helical coil 60 illustrated in FIGS. 8 and 9, for example. FIGS. 8 and 9 are enlarged schematic perspective views of a portion of the helical coil 60 as a modification example of the helical coil 6, and correspond to FIGS. 5A and 5B, respectively. The helical coil 60 may include a coil part 60A and a coil part 60B. As illustrated in FIGS. 8 and 9, the coil part 60A may be wound around the magnetoresistive effect elements 11 and 14 in the first winding direction CD1 while extending along the X-axis direction, for example. The coil part 60B may be wound around the magnetoresistive effect elements 13 and 12 in the first winding direction CD1 while extending along the X-axis direction. A first end of the coil part 60A and a first end of the coil part 60B may be coupled to each other via a coupling part 60J. The terminal T3 may be coupled to the coupling part 60J. The terminal T3 may be a frame ground (FG), for example. The terminal T1 may be coupled to a second end of the coil part 60A, and the terminal T2 may be coupled to a second end of the coil part 60B.

As illustrated in FIG. 8, the helical coil 60 may be configured to receive supply of the feedback currents If1 and If2 between, for example, the terminal T1 and the terminal T2 from the power supply. Note that in FIG. 8, arrows indicate the feedback current If1 flowing from the terminal T2 to the terminal T1. The feedback current If2 is to flow in the opposite direction to the direction indicated by the arrows in FIG. 8, thus flowing from the terminal T1 to the terminal T2.

As illustrated in FIG. 9, the helical coil 60 may be configured to receive supply of the setting current Is and the resetting current Ir between the terminal T1 and the terminal T3 and between the terminal T2 and the terminal T3 from the power supply. Note that in FIG. 9, arrows indicate the setting current Is flowing from the terminal T3 to the terminal T1 and also from the terminal T3 to the terminal T2. The resetting current Ir is to flow in the opposite directions to the directions indicated by the arrows in FIG. 9, thus flowing from the terminal T1 to the terminal T3 and also from the terminal T2 to the terminal T3.

In the present modification example, the setting and resetting operations may be carried out by alternately applying the setting current Is and the resetting current Ir between the terminal T1 and the terminal T3 and between the terminal T2 and the terminal T3. Further, in detecting the signal currents Im1 and Im2 flowing through the bus 5, supplying the feedback currents If1 and If2 between the terminal T1 and the terminal T2 makes it possible to measure the signal currents Im1 and Im2.

Figure 10A:
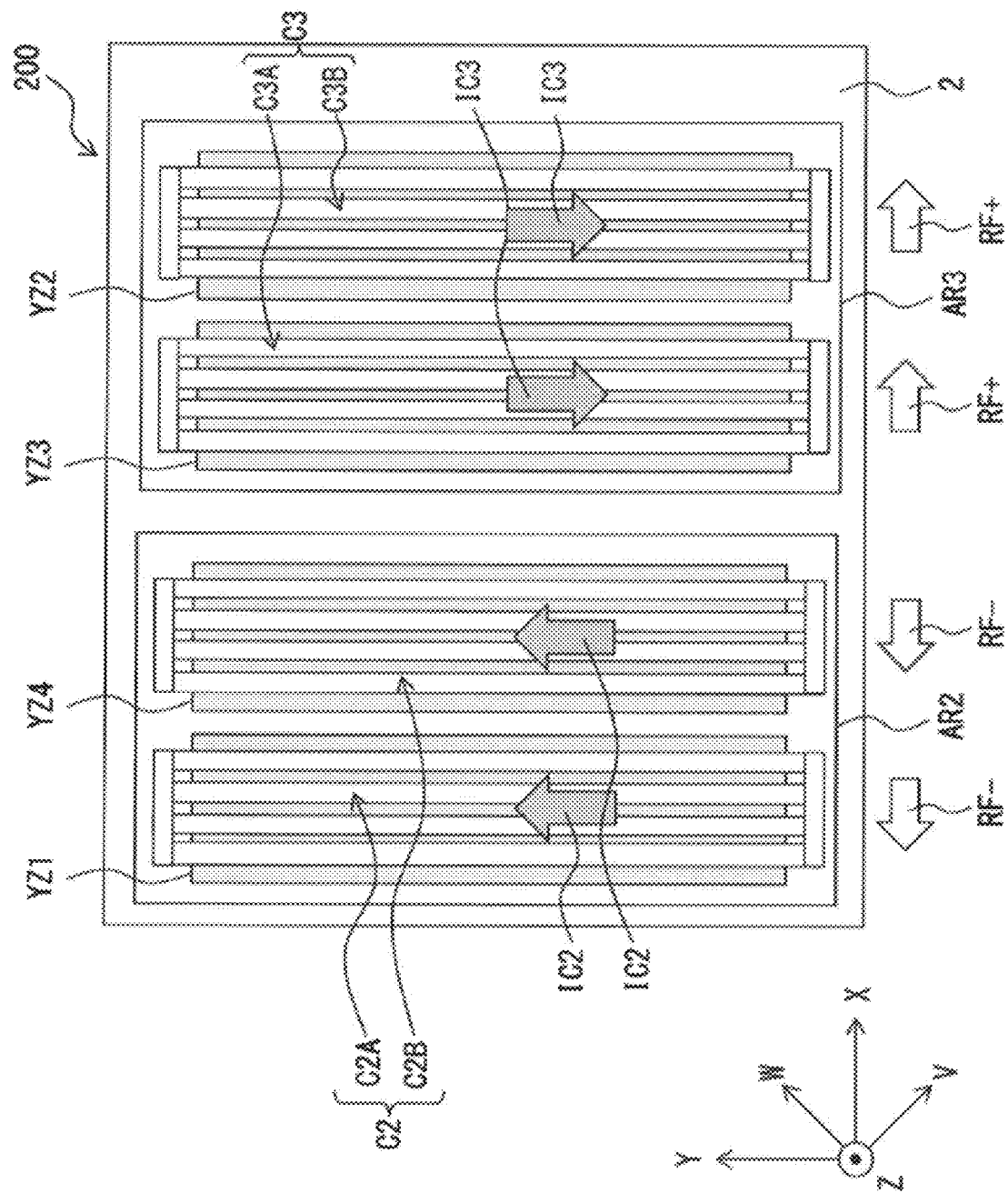
FIG. 10A is a schematic planar diagram illustrating an overall configuration example of a magnetic field detection apparatus according to one example embodiment of the disclosure.
Figure 10B:
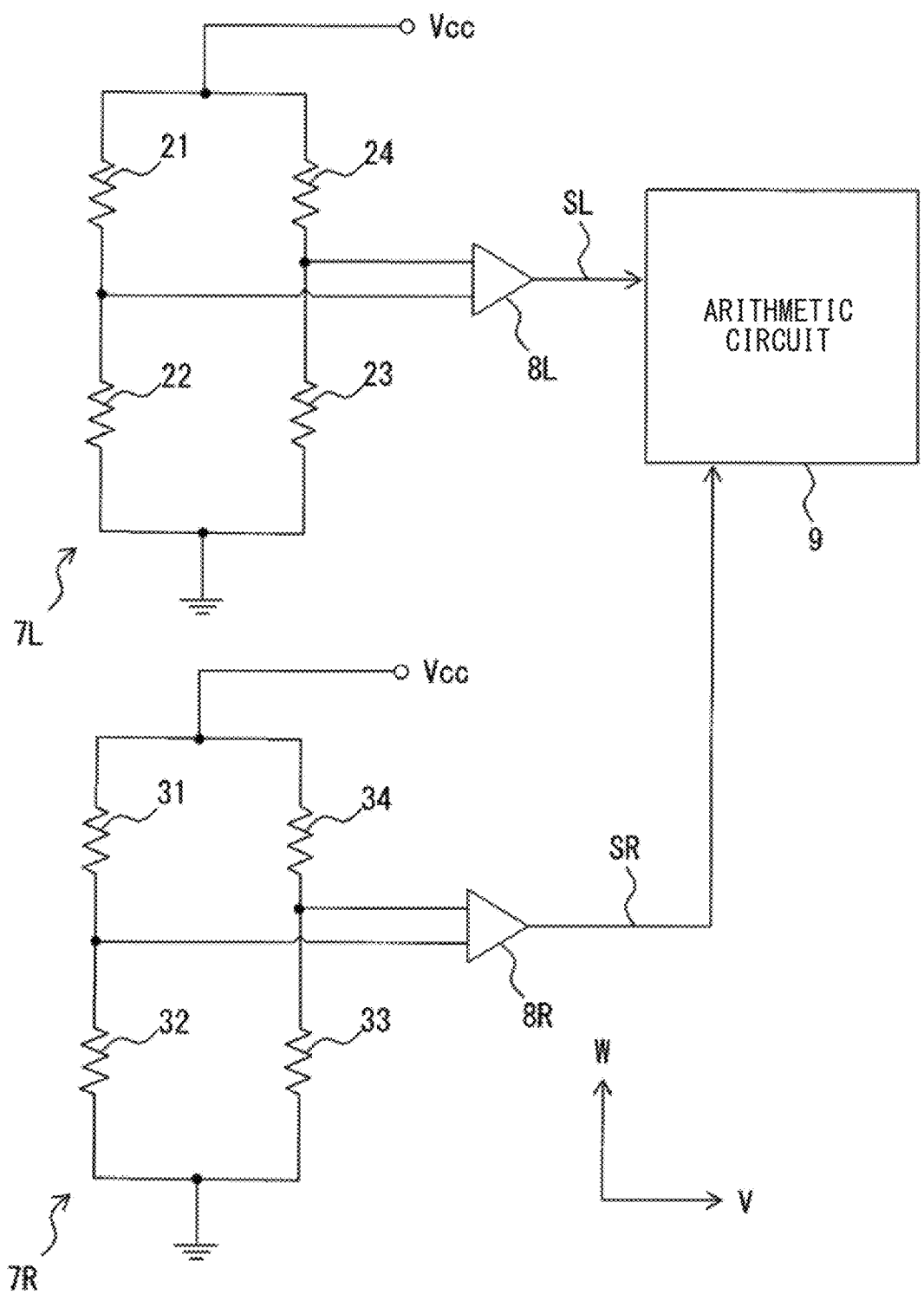
FIG. 10B is a circuit diagram of the magnetic field detection apparatus illustrated in FIG. 10A.

In the foregoing example embodiment, the current detection apparatus that detects a change in a signal current flowing through a conductor has been described; however, uses of the technology are not limited thereto. The technology is also applicable, for example, to an electromagnetic compass that detects geomagnetism, like a magnetic field detection apparatus 200 according to one example embodiment of the disclosure illustrated in FIGS. 10A and 10B. The magnetic field detection apparatus 200 illustrated in FIGS. 10A and 10B may be a two-axis magnetic detection compass that is configured to detect a change in a magnetic field in the Y-axis direction and a change in the magnetic field in the Z-axis direction, for example. FIG. 10A is a schematic planar diagram illustrating an overall configuration example of the magnetic field detection apparatus 200. FIG. 10B is a circuit diagram illustrating a circuit configuration example of the magnetic field detection apparatus 200.

As illustrated in FIG. 10A, the magnetic field detection apparatus 200 may include two magnetic field detection units AR2 and AR3 on a substrate 2.

As illustrated in FIG. 10B, in the magnetic field detection apparatus 200, a bridge circuit 7L using four magnetoresistive effect elements 21 to 24 may be formed in the magnetic field detection unit AR2, and a bridge circuit 7R using four magnetoresistive effect elements 31 to 34 may be formed in the magnetic field detection unit AR3. It is possible for the magnetic field detection apparatus 200 to detect changes in the magnetic field in the Y-axis direction and the Z-axis direction by using the two bridge circuits 7L and 7R. The magnetoresistive effect elements 21 to 24 and 31 to 34 are configured to detect a change in a signal magnetic field to be detected. Here, the magnetoresistive effect elements 21, 23, 31, and 33 may each have a resistance value that decreases upon application of a signal magnetic field in the +Y direction or a signal magnetic field in a +Z direction and increases upon application of a signal magnetic field in the −Y direction or a signal magnetic field in a −Z direction. The magnetoresistive effect elements 22, 24, 32, and 34 may each have a resistance value that increases upon application of a signal magnetic field in the +Y direction or a signal magnetic field in the +Z direction and decreases upon application of a signal magnetic field in the −Y direction or a signal magnetic field in the −Z direction. Accordingly, in response to a change in the signal magnetic field, the magnetoresistive effect elements 21, 23, 31, and 33 and the magnetoresistive effect elements 22, 24, 32, and 34 may output signals that are different in phase by 180° from each other, for example. The signals extracted from the bridge circuit 7L may flow into a difference detector 8L, and the signals extracted from the bridge circuit 7R may flow into a difference detector 8R. A difference signal SL from the difference detector 8L and a difference signal SR from the difference detector 8R may both flow into the arithmetic circuit 9.

The magnetic field detection unit AR2 may be substantially the same in structure as the current detection apparatus 100 described in the foregoing example embodiment except that: the bus 5 is not provided; element formation regions YZ1 and YZ4 are provided in place of the element formation regions X1 to X4; and a helical coil C2 is provided in place of the helical coil 6. The helical coil C2 may be substantially the same in structure as the helical coil 6, and may include coil parts C2A and C2B. The respective upper wiring lines in the coil parts C2A and C2B may each be branched into four upper wiring lines that are coupled to each other in parallel, and may be configured to allow a setting current IC2 in the +Y direction to flow therethrough.

The magnetic field detection unit AR3 may be substantially the same in structure as the current detection apparatus 100 described in the foregoing example embodiment except that: the bus 5 is not provided; element formation regions YZ3 and YZ2 are provided in place of the element formation regions X1 to X4; and a helical coil C3 is provided in place of the helical coil 6. The helical coil C3 may be substantially the same in structure as the helical coil 6, and may include coil parts C3A and C3B. The respective upper wiring lines in the coil parts C3A and C3B may each be branched into four upper wiring lines that are coupled to each other in parallel, and may be configured to allow a resetting current IC3 in the −Y direction to flow therethrough.

Figure 11A:
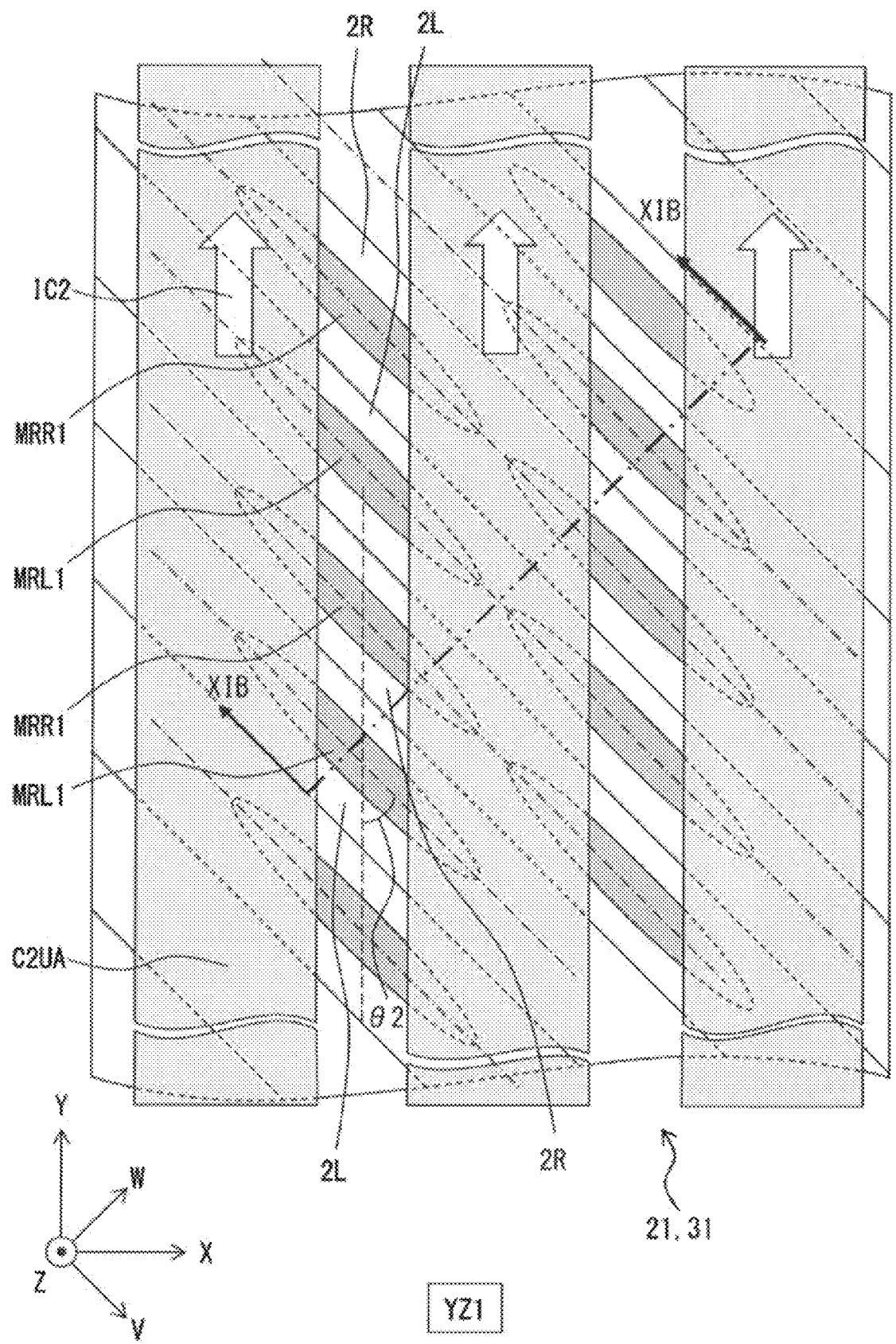
FIG. 11A is a planar diagram for explaining a detailed configuration of a first element formation region illustrated in FIG. 10A.
Figure 11B:
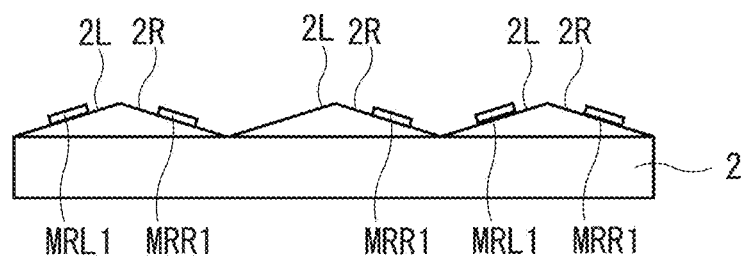
FIG. 11B is a cross-sectional diagram for explaining the detailed configuration of the first element formation region illustrated in FIG. 10A.

FIG. 11A is a planar diagram for explaining a detailed configuration of the magnetoresistive effect elements 21 and 31 formed in the element formation region YZ1. FIG. 11B illustrates a cross section along line XIB-XIB in FIG. 11A as viewed in the direction of the arrows. In the element formation region YZ1, as illustrated in FIG. 11A, inclined surfaces 2L and 2R each extending in the V-axis direction may be formed on a surface of the substrate 2. The V-axis direction may form an angle θ2 with respect to the Y-axis direction. The inclined surfaces 2L and 2R may both be inclined with respect to the X-Y plane. The inclined surface 2L and the inclined surface 2R may also be inclined with respect to each other. A plurality of magnetoresistive effect films MRL1 and a plurality of magnetoresistive effect films MRR1 each extending in the V-axis direction may be formed on the inclined surface 2L and the inclined surface 2R, respectively. The plurality of magnetoresistive effect films MRL1 may be coupled to each other in series to form the magnetoresistive effect element 21. The plurality of magnetoresistive effect films MRR1 may be coupled to each other in series to form the magnetoresistive effect element 31. Note that FIG. 11A illustrates the plurality of magnetoresistive effect films MRL1 forming the magnetoresistive effect element 21, the plurality of magnetoresistive effect films MRR1 forming the magnetoresistive effect element 31, and an upper wiring line pattern C2UA disposed thereabove, and omits other components.

The V-axis direction may correspond to a specific but non-limiting example of a "first axis direction" according to one embodiment of the disclosure. The inclined surface 2L may correspond to a specific but non-limiting example of a "first surface" according to one embodiment of the disclosure. The inclined surface 2R may correspond to a specific but non-limiting example of a "second surface" according to one embodiment of the disclosure.

Figure 12:
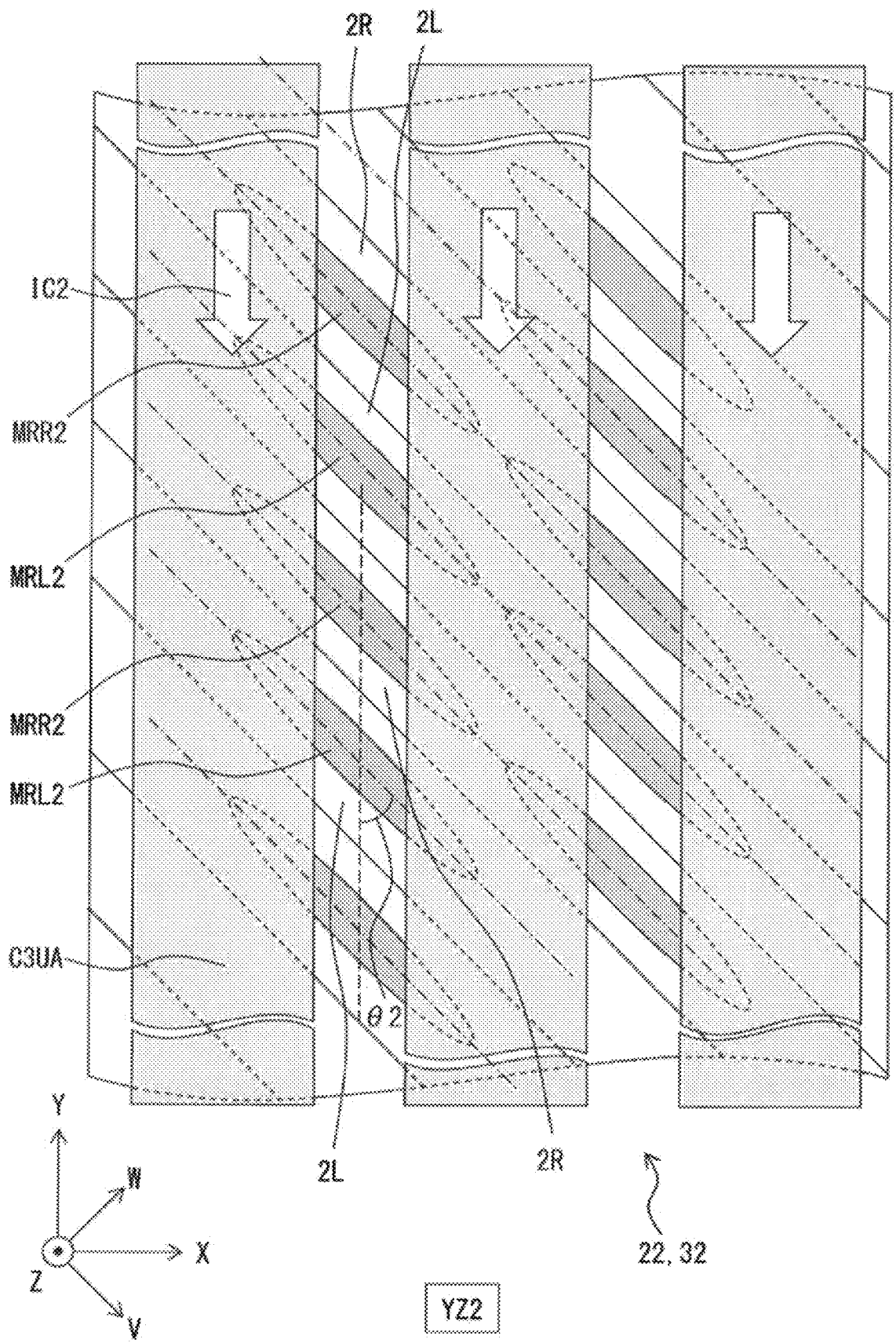
FIG. 12 is a planar diagram for explaining a detailed configuration of a second element formation region illustrated in FIG. 10A.

FIG. 12 is a planar diagram for explaining a detailed configuration of the magnetoresistive effect elements 22 and 32 formed in the element formation region YZ2. In the element formation region YZ2, the inclined surfaces 2L and 2R each extending in the V-axis direction may also be formed on the surface of the substrate 2. The V-axis direction may form the angle θ2 with respect to the Y-axis direction. A plurality of magnetoresistive effect films MRL2 and a plurality of magnetoresistive effect films MRR2 each extending in the V-axis direction may be formed on the inclined surface 2L and the inclined surface 2R, respectively. The plurality of magnetoresistive effect films MRL2 may be coupled to each other in series to form the magnetoresistive effect element 22. The plurality of magnetoresistive effect films MRR2 may be coupled to each other in series to form the magnetoresistive effect element 32.

Figure 13:
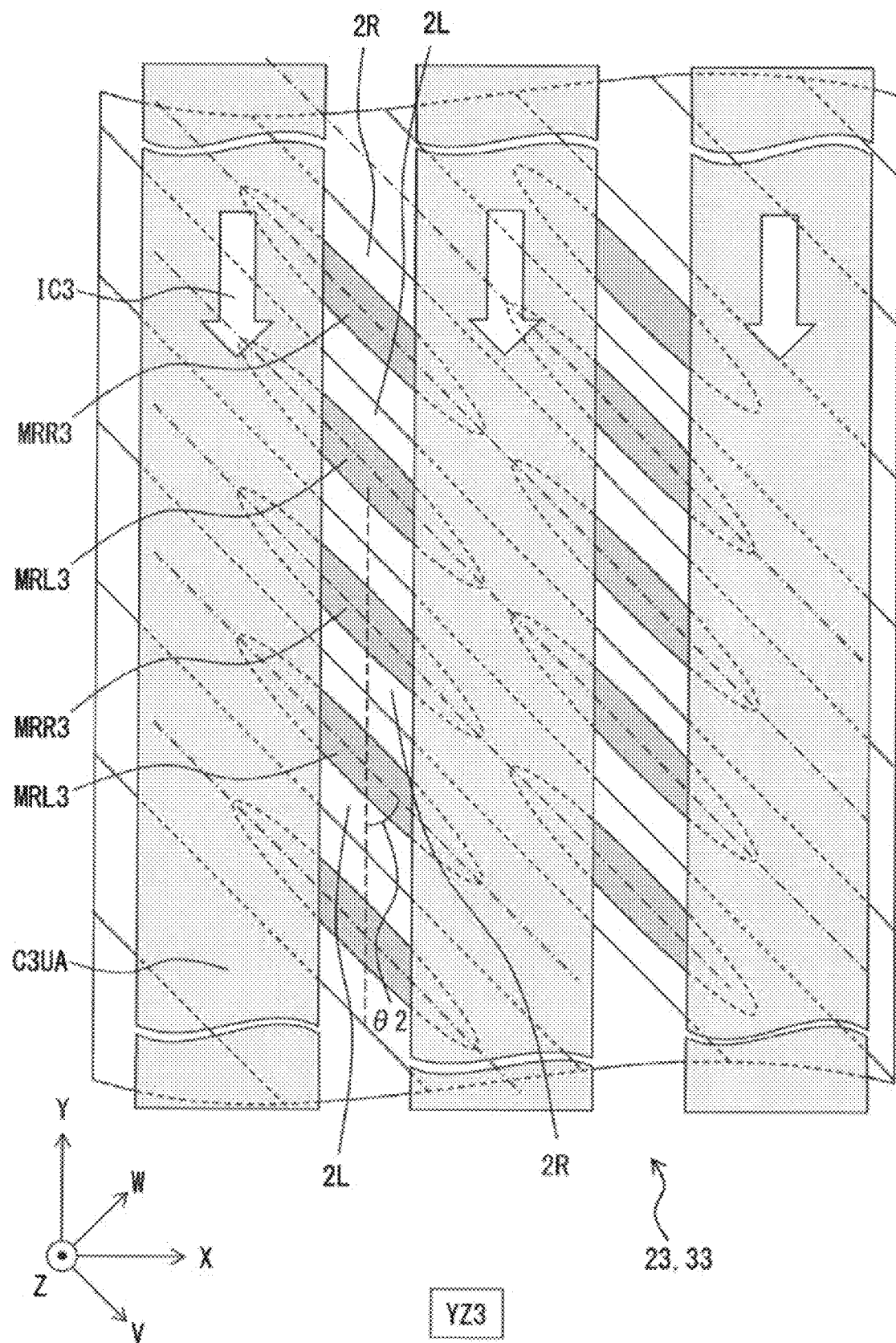
FIG. 13 is a planar diagram for explaining a detailed configuration of a third element formation region illustrated in FIG. 10A.

FIG. 13 is a planar diagram for explaining a detailed configuration of the magnetoresistive effect elements 23 and 33 formed in the element formation region YZ3. In the element formation region YZ3, the inclined surfaces 2L and 2R each extending in the V-axis direction may also be formed on the surface of the substrate 2. The V-axis direction may form the angle θ2 with respect to the Y-axis direction. A plurality of magnetoresistive effect films MRL3 and a plurality of magnetoresistive effect films MRR3 each extending in the V-axis direction may be formed on the inclined surface 2L and the inclined surface 2R, respectively. The plurality of magnetoresistive effect films MRL3 may be coupled to each other in series to form the magnetoresistive effect element 23. The plurality of magnetoresistive effect films MRR3 may be coupled to each other in series to form the magnetoresistive effect element 33.

Figure 14:
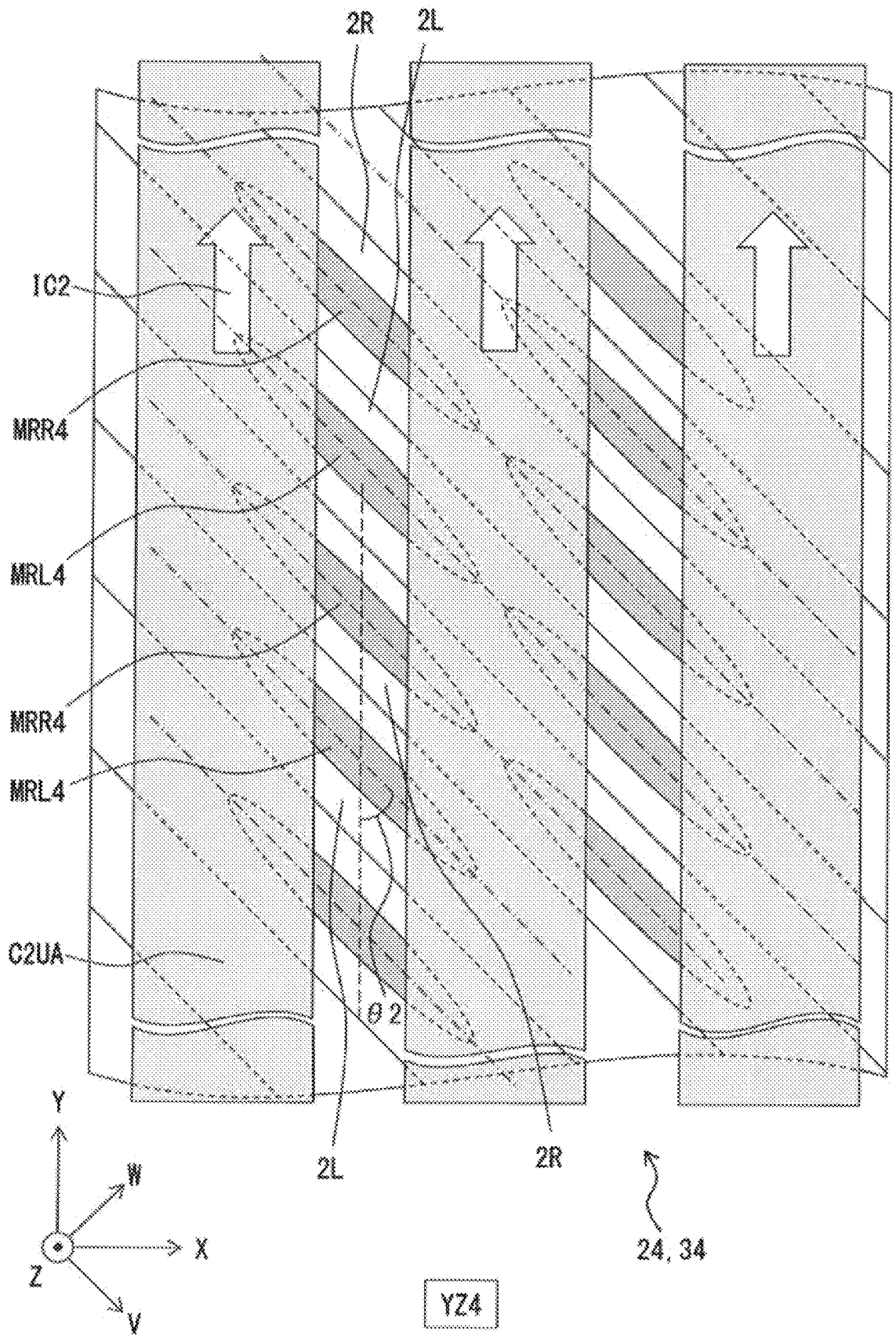
FIG. 14 is a planar diagram for explaining a detailed configuration of a fourth element formation region illustrated in FIG. 10A.

FIG. 14 is a planar diagram for explaining a detailed configuration of the magnetoresistive effect elements 24 and 34 formed in the element formation region YZ4. In the element formation region YZ4, the inclined surfaces 2L and 2R each extending in the V-axis direction may also be formed on the surface of the substrate 2. The V-axis direction may form the angle θ2 with respect to the Y-axis direction. A plurality of magnetoresistive effect films MRL4 and a plurality of magnetoresistive effect films MRR4 each extending in the V-axis direction may be formed on the inclined surface 2L and the inclined surface 2R, respectively. The plurality of magnetoresistive effect films MRL4 may be coupled to each other in series to form the magnetoresistive effect element 24. The plurality of magnetoresistive effect films MRR4 may be coupled to each other in series to form the magnetoresistive effect element 34.

It should be noted that combining the foregoing magnetic field detection apparatus 200 with a magnetic field detection unit (which will be referred to as a magnetic field detection unit ΔR1 for convenience) that is configured to detect a change in a magnetic field in the X-axis direction makes it possible to implement a three-axis magnetic field detection compass that detects changes in a magnetic field in three-axis directions. The magnetic field detection unit ΔR1 herein may be a unit that is substantially the same in structure as the current detection apparatus 100 described in the foregoing example embodiment except that the bus 5 is not provided.

Furthermore, the technology encompasses any possible combination of some or all of the various embodiments and the modifications described herein and incorporated herein.

It is possible to achieve at least the following configurations from the foregoing embodiments and modification examples of the disclosure.

(1)
A magnetic field detection apparatus including:
 a magnetoresistive effect element including a magnetoresistive effect film that extends in a first axis direction and includes a first end part, a second end part, and an intermediate part between the first end part and the second end part; and
 a conductor including a first part and a second part that each extend in a second axis direction inclined with respect to the first axis direction,
 the first part and the second part respectively overlapping the first end part and the second end part in a fourth axis direction orthogonal to the second axis direction.

(2)
The magnetic field detection apparatus according to (1), in which the first part and the second part are coupled to each other in parallel.

(3)
The magnetic field detection apparatus according to (1) or (2), in which
the conductor further includes:
 a plurality of third parts each extending in the second axis direction, the third parts being disposed opposite to the first part, with the magnetoresistive effect element being interposed between the first part and the third parts in the fourth axis direction; and
 a plurality of fourth parts each extending in the second axis direction, the fourth parts being disposed opposite to the second part, with the magnetoresistive effect element being interposed between the second part and the fourth parts in the fourth axis direction.

(4)
The magnetic field detection apparatus according to any one of (1) to (3), in which the conductor includes a helical coil that is wound around the magnetoresistive effect element while extending along a third axis direction orthogonal to the second axis direction.

(5)
The magnetic field detection apparatus according to (4), in which
a plurality of the magnetoresistive effect elements includes a first magnetoresistive effect element and a second magnetoresistive effect element, and the helical coil includes:
a first helical coil part that is wound around the first magnetoresistive effect element in a first winding direction while extending along the third axis direction; and
a second helical coil part that is wound around the second magnetoresistive effect element in a second winding direction opposite to the first winding direction while extending along the third axis direction, the second helical coil part being coupled to the first helical coil part in series.

(6)
The magnetic field detection apparatus according to any one of (1) to (5), in which
the first end part and the second end part respectively include a first end and a second end of the magnetoresistive effect film that are opposite to each other in the first axis direction,
the first part overlaps the first end in the first end part in the fourth axis direction, and
the second part overlaps the second end in the second end part in the fourth axis direction.

(7)
The magnetic field detection apparatus according to any one of (1) to (4), in which
a plurality of the magnetoresistive effect elements includes a first magnetoresistive effect element including a first magnetization free layer, and a second magnetoresistive effect element including a second magnetization free layer, and
the conductor is configured to generate the induction magnetic field to cause a magnetization of the first magnetization free layer and a magnetization of the second magnetization free layer to be oriented in opposite directions.

(8)
A magnetic field detection apparatus including:
a first magnetoresistive effect element including a first magnetoresistive effect film that extends in a first axis direction;
a first conductor including a first part and a second part that each extend in a second axis direction inclined with respect to the first axis direction and that are adjacent to each other in a third axis direction different from both of the first axis direction and the second axis direction;
a second conductor including a third part and a fourth part that each extend in the second axis direction and that are adjacent to each other in the third axis direction; and
a second magnetoresistive effect element including a second magnetoresistive effect film that extends in the first axis direction, in which
the first magnetoresistive effect film includes a first end part, a second end part, and a first intermediate part between the first end part and the second end part,
the second magnetoresistive effect film includes a third end part, a fourth end part, and a second intermediate part between the third end part and the fourth end part,
the first part and the second part of the first conductor respectively overlap the first end part and the second end part of the first magnetoresistive effect film in a fourth axis direction orthogonal to both of the second axis direction and the third axis direction, and
the third part and the fourth part of the second conductor respectively overlap the third end part and the fourth end part of the second magnetoresistive effect film in the fourth axis direction.

(9)
The magnetic field detection apparatus according to (8), further including:
a substrate including a first surface and a second surface, the first surface being parallel to the first axis direction and inclined with respect to the second axis direction and the third axis direction, the second surface being parallel to the first axis direction and inclined with respect to the first surface;
a first bridge circuit; and
a second bridge circuit;
in which
the first bridge circuit includes a first pair of the first magnetoresistive effect element and the second magnetoresistive effect element, the first magnetoresistive effect film of the first magnetoresistive effect element of the first pair being provided on the first surface, the second magnetoresistive effect film of the second magnetoresistive effect element of the first pair being provided on the first surface, and
the second bridge circuit includes a second pair of the first magnetoresistive effect element and the second magnetoresistive effect element, the first magnetoresistive effect film of the first magnetoresistive effect element of the second pair being provided on the second surface, the second magnetoresistive effect film of the second magnetoresistive effect element of the second pair being provided on the second surface.

(10)
The magnetic field detection apparatus according to any one of (1) to (9), in which
the magnetoresistive effect film includes a plurality of the magnetoresistive effect films, and
the respective first end parts of every two of the magnetoresistive effect films adjacent to each other in the third axis direction are located at different positions in the second axis direction.

(11)
The magnetic field detection apparatus according to any one of (1) to (10), in which an angle of inclination of the second axis direction with respect to the first axis direction is substantially 45 degrees.

(12)
The magnetic field detection apparatus according to (10) or (11), further including a substrate including a first surface and a second surface, the first surface being parallel to the first axis direction and inclined with respect to the second axis direction and the fourth axis direction, the second surface being parallel to the first axis direction and inclined with respect to the first surface, in which
the plurality of magnetoresistive effect films includes a first magnetoresistive effect film and a second magnetoresistive effect film,
the first magnetoresistive effect film is provided on the first surface, and
the second magnetoresistive effect film is provided on the second surface.

The magnetic field detection apparatus according to at least one embodiment of the disclosure provides high detection accuracy while being small in size.

Although the disclosure has been described hereinabove in terms of the example embodiment and modification examples, it is not limited thereto. It should be appreciated that variations may be made in the described example embodiment and modification examples by those skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. The use of the terms first, second, etc. do not denote any order or importance, but rather the terms first, second, etc. are used to distinguish one element from another. The term "substantially" and its variants are defined as being largely but not necessarily wholly what is specified as understood by one of ordinary skill in the art. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. A magnetic field detection apparatus comprising:
   a magnetoresistive effect element including a magnetoresistive effect film that extends in a first axis direction and includes a first end part, a second end part, and an intermediate part between the first end part and the second end part; and
   a conductor including a first part and a second part that each extend in a second axis direction inclined with respect to the first axis direction,
   the first part and the second part respectively overlapping the first end part and the second end part in a fourth axis direction orthogonal to the second axis direction.

2. The magnetic field detection apparatus according to claim 1, wherein the first part and the second part are coupled to each other in parallel.

3. The magnetic field detection apparatus according to claim 1, wherein
   the conductor further includes:
      a plurality of third parts each extending in the second axis direction, the third parts being disposed opposite to the first part, with the magnetoresistive effect element being interposed between the first part and the third parts in the fourth axis direction; and
      a plurality of fourth parts each extending in the second axis direction, the fourth parts being disposed opposite to the second part, with the magnetoresistive effect element being interposed between the second part and the fourth parts in the fourth axis direction.

4. The magnetic field detection apparatus according to claim 1, wherein the conductor comprises a helical coil that is wound around the magnetoresistive effect element while extending along a third axis direction orthogonal to the second axis direction.

5. The magnetic field detection apparatus according to claim 4, wherein
   a plurality of the magnetoresistive effect elements includes a first magnetoresistive effect element and a second magnetoresistive effect element, and
   the helical coil includes:
      a first helical coil part that is wound around the first magnetoresistive effect element in a first winding direction while extending along the third axis direction; and
      a second helical coil part that is wound around the second magnetoresistive effect element in a second winding direction opposite to the first winding direction while extending along the third axis direction, the second helical coil part being coupled to the first helical coil part in series.

6. The magnetic field detection apparatus according to claim 1, wherein
   the first end part and the second end part respectively include a first end and a second end of the magnetoresistive effect film that are opposite to each other in the first axis direction,
   the first part overlaps the first end in the first end part in the fourth axis direction, and
   the second part overlaps the second end in the second end part in the fourth axis direction.

7. The magnetic field detection apparatus according to claim 1, wherein
   a plurality of the magnetoresistive effect elements includes a first magnetoresistive effect element including a first magnetization free layer, and a second magnetoresistive effect element including a second magnetization free layer, and
   the conductor is configured to generate the induction magnetic field to cause a magnetization of the first magnetization free layer and a magnetization of the second magnetization free layer to be oriented in opposite directions.

8. The magnetic field detection apparatus according to claim 1, wherein
   the magnetoresistive effect film comprises a plurality of the magnetoresistive effect films, and
   the respective first end parts of every two of the magnetoresistive effect films adjacent to each other in the third axis direction are located at different positions in the second axis direction.

9. The magnetic field detection apparatus according to claim 8, further comprising a substrate including a first surface and a second surface, the first surface being parallel to the first axis direction and inclined with respect to the second axis direction and the fourth axis direction, the second surface being parallel to the first axis direction and inclined with respect to the first surface, wherein
   the plurality of magnetoresistive effect films includes a first magnetoresistive effect film and a second magnetoresistive effect film,
   the first magnetoresistive effect film is provided on the first surface, and
   the second magnetoresistive effect film is provided on the second surface.

10. The magnetic field detection apparatus according to claim 1, wherein an angle of inclination of the second axis direction with respect to the first axis direction is substantially 45 degrees.

11. A magnetic field detection apparatus comprising:
    a first magnetoresistive effect element including a first magnetoresistive effect film that extends in a first axis direction;
    a first conductor including a first part and a second part that each extend in a second axis direction inclined with respect to the first axis direction and that are adjacent to each other in a third axis direction different from both of the first axis direction and the second axis direction;
    a second conductor including a third part and a fourth part that each extend in the second axis direction and that are adjacent to each other in the third axis direction; and
    a second magnetoresistive effect element including a second magnetoresistive effect film that extends in the first axis direction, wherein the first magnetoresistive effect film includes a first end part, a second end part, and a first intermediate part between the first end part and the second end part, the second magnetoresistive effect film includes a third end part, a fourth end part, and a second intermediate part between the third end part and the fourth end part, the first part and the second part of the first conductor respectively overlap the first end part and the second end part of the first magnetoresistive effect film in a fourth axis direction orthogonal to both of the second axis direction and the third axis direction, and the third part and the fourth part of the second conductor respectively overlap the third end part and the fourth end part of the second magnetoresistive effect film in the fourth axis direction.

12. The magnetic field detection apparatus according to claim 11, further comprising:

a substrate including a first surface and a second surface, the first surface being parallel to the first axis direction and inclined with respect to the second axis direction and the third axis direction, the second surface being parallel to the first axis direction and inclined with respect to the first surface;

a first bridge circuit; and a second bridge circuit;

wherein the first bridge circuit includes a first pair of the first magnetoresistive effect element and the second magnetoresistive effect element, the first magnetoresistive effect film of the first magnetoresistive effect element of the first pair being provided on the first surface, the second magnetoresistive effect film of the second magnetoresistive effect element of the first pair being provided on the first surface, and the second bridge circuit includes a second pair of the first magnetoresistive effect element and the second magnetoresistive effect element, the first magnetoresistive effect film of the first magnetoresistive effect element of the second pair being provided on the second surface, the second magnetoresistive effect film of the second magnetoresistive effect element of the second pair being provided on the second surface.

* * * * *